(12) United States Patent
Parkin

(10) Patent No.: US 6,970,379 B2
(45) Date of Patent: Nov. 29, 2005

(54) SYSTEM AND METHOD FOR STORING DATA IN AN UNPATTERNED, CONTINUOUS MAGNETIC LAYER

(75) Inventor: Stuart S. P. Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 10/685,835

(22) Filed: Oct. 14, 2003

(65) Prior Publication Data

US 2005/0078511 A1    Apr. 14, 2005

(51) Int. Cl.[7] .............................................. G11C 11/15
(52) U.S. Cl. ......................... 365/173; 365/171; 365/51
(58) Field of Search ................................ 365/173, 171, 365/51, 115.5, 66, 55, 225.5

(56) References Cited

U.S. PATENT DOCUMENTS

| | | | |
|---|---|---|---|
| 3,611,328 A | 10/1971 | Spain | 340/174 TF |
| 3,846,770 A | 11/1974 | Schwee et al. | 340/174 |
| 3,868,659 A | 2/1975 | Schwee | 340/174 |
| 3,997,885 A | 12/1976 | Battarel | 340/174 |
| 4,075,612 A | 2/1978 | Johnson et al. | 365/171 |
| 4,075,613 A | 2/1978 | Torok | 365/87 |
| 4,080,591 A | 3/1978 | Torok | 365/171 |
| 4,192,012 A | 3/1980 | Schwee et al. | 365/87 |
| 4,199,819 A | 4/1980 | Schwee et al. | 365/87 |
| 4,250,565 A | 2/1981 | Cosimini et al. | 365/87 |
| 4,253,160 A | 2/1981 | Paul et al. | 365/87 |
| 4,253,161 A | 2/1981 | Paul et al. | 365/87 |
| 4,410,963 A | 10/1983 | Lo et al. | 365/87 |
| 5,650,958 A | 7/1997 | Gallagher et al. | 365/173 |
| 5,729,410 A | 3/1998 | Fontana, Jr. et al. | 360/113 |
| 5,801,984 A | 9/1998 | Parkin | 365/158 |
| 6,754,099 B2 * | 6/2004 | Hidaka | 365/173 |
| 2002/0101761 A1 | 8/2002 | Naji | 365/171 |
| 2003/0107833 A1 | 6/2003 | Rettner et al. | 360/48 |
| 2003/0128460 A1 | 7/2003 | Zolla | 360/97.01 |

OTHER PUBLICATIONS

L. Geppert, "The New Incredible Memories," IEEE Spectrum, Apr. 2003, pp. 49-54.

Richard Butner, "Computing Unplugged, Magnetic RAM cures your computer of short-ter memory loss," available at: http://www.research.ibm.com/thinkresearch/pages/2001/20010202_mram.shtml, as of May 14, 2003.

(Continued)

Primary Examiner—David Lam
(74) Attorney, Agent, or Firm—Samuel A. Kassatly

(57) ABSTRACT

Digital information is stored in an unpatterned magnetic film, using the inherent, natural properties of the domain walls in ferromagnetic materials to write data on an unpatterned magnetic film. Data is read from the unpatterned magnetic film using magnetic tunneling junctions (MTJs). To achieve sufficient thermal stability, the magnetic fields required to change the orientation of these magnetic regions may be much larger than can be provided by currents passing through wires. This larger magnetic field is achieved by using the domain wall fringing field generated at the boundary between two magnetic domain walls. The magnetic regions are written by using the fringing fields from magnetic domain walls in neighboring magnetic wires. These wires are brought close to the magnetic storage layer where the magnetic storage regions are to be written.

119 Claims, 19 Drawing Sheets

OTHER PUBLICATIONS

Y. Ooba et al., "A Thin Magnetic Film Shift Register," Paper 6.4, presented at the 1972 INTERMAG Conference, Kyoto, Japan, Apr. 10-13, 1972.

Hermann Deichelmann, "Magnetic Domain Tip Memories—Construction and Applications," Journal of Magnetism and Magnetic Materials 4 (1977) 174-179.

D.H. Smith, "A Magnetic Shift Register Employing Controlled Domain Wall Motion," IEEE Transaction on Magnetics, vol. Mag-1, No. 4, Dec. 1965, pp. 281-284.

J. S. Sallo et al., "An "ORTHOCORE" Magnetic Shift Register," IEEE Transactions on Magnetics, vol. MAG-2, No. 3, Sep. 1966, pp. 197-201.

* cited by examiner

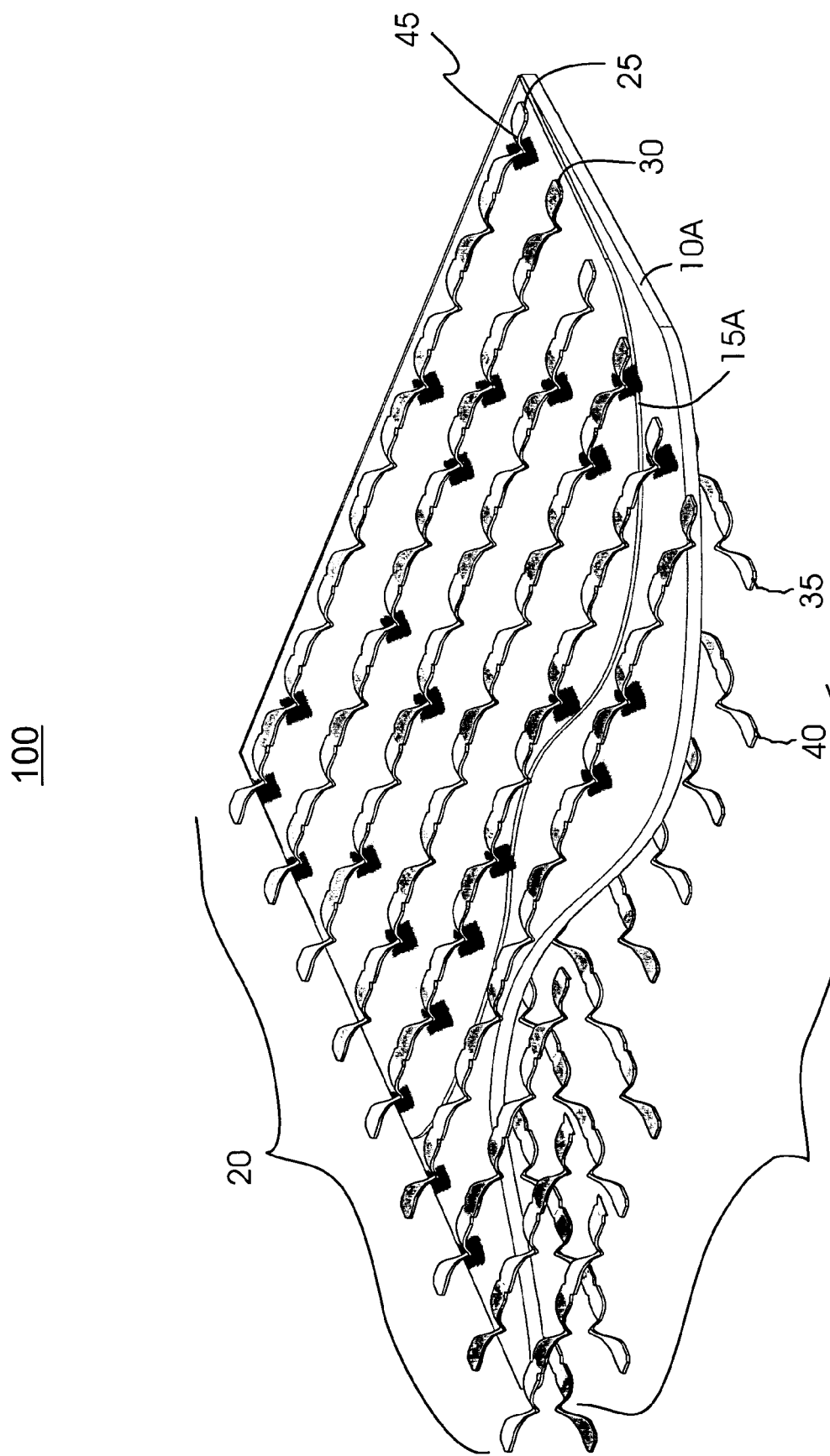

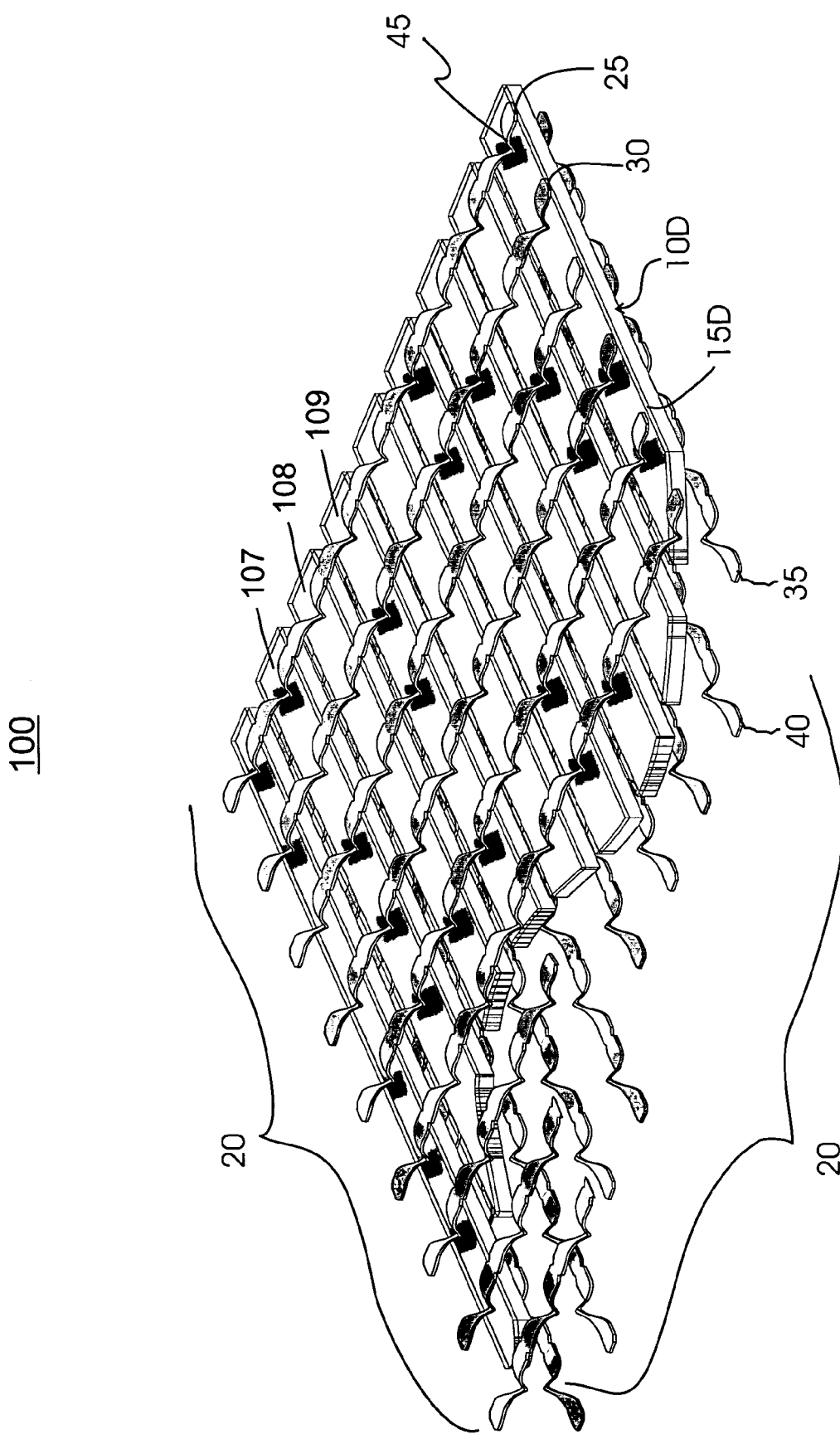

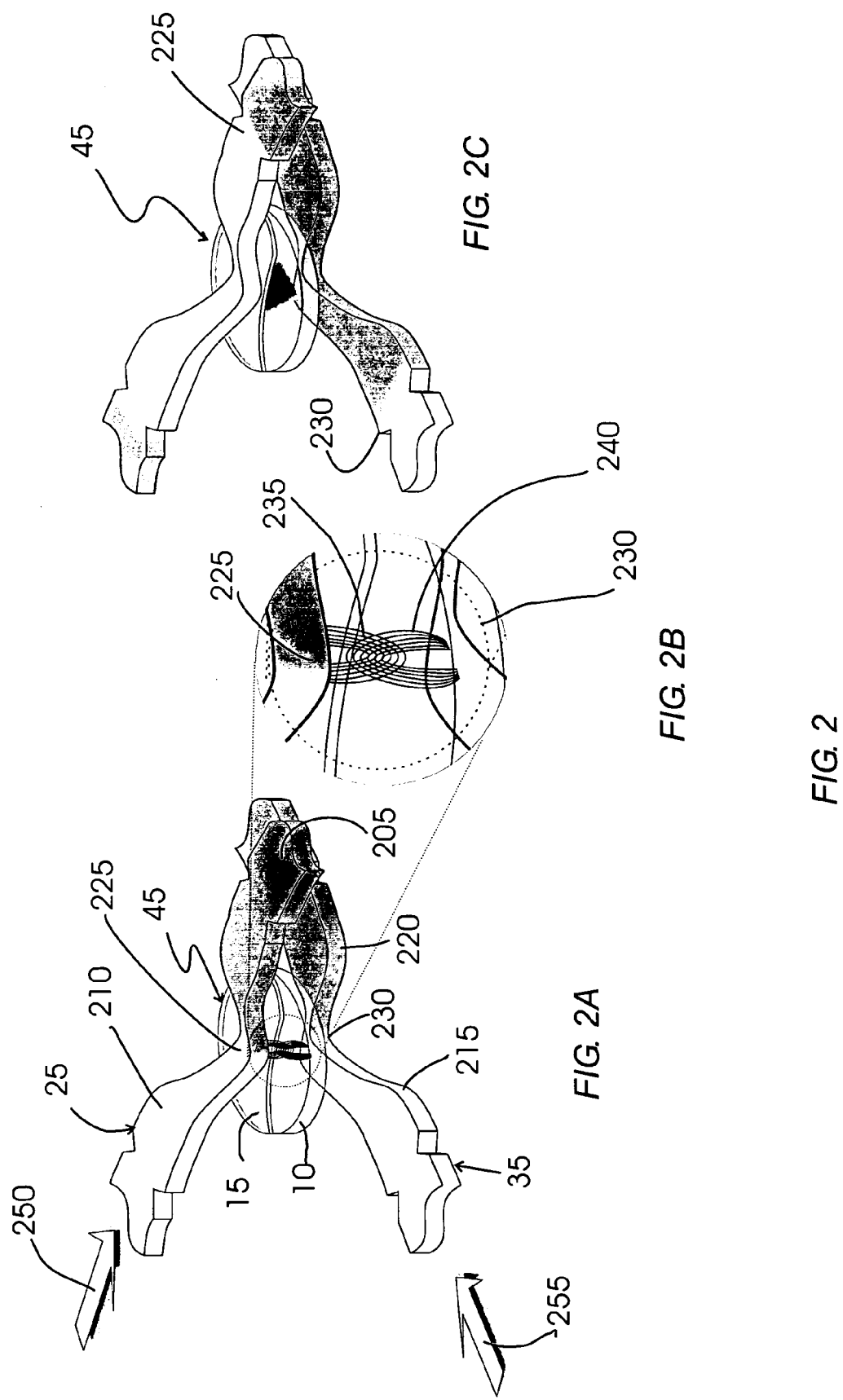

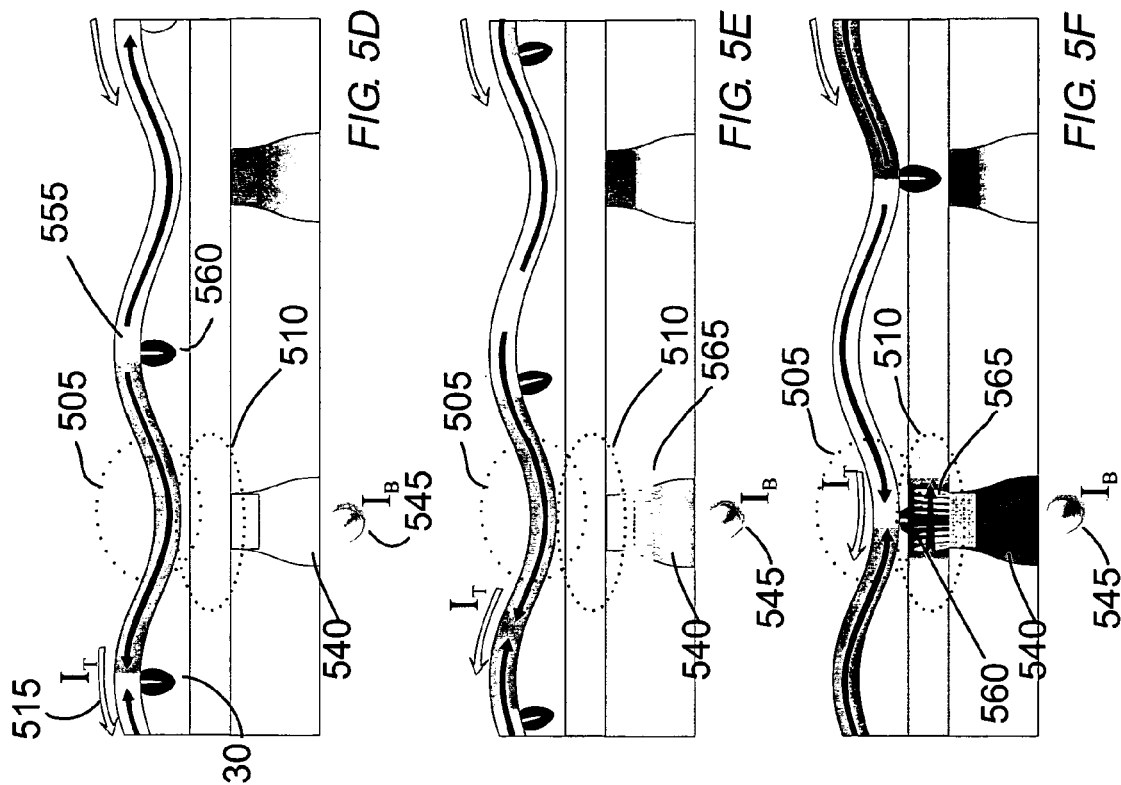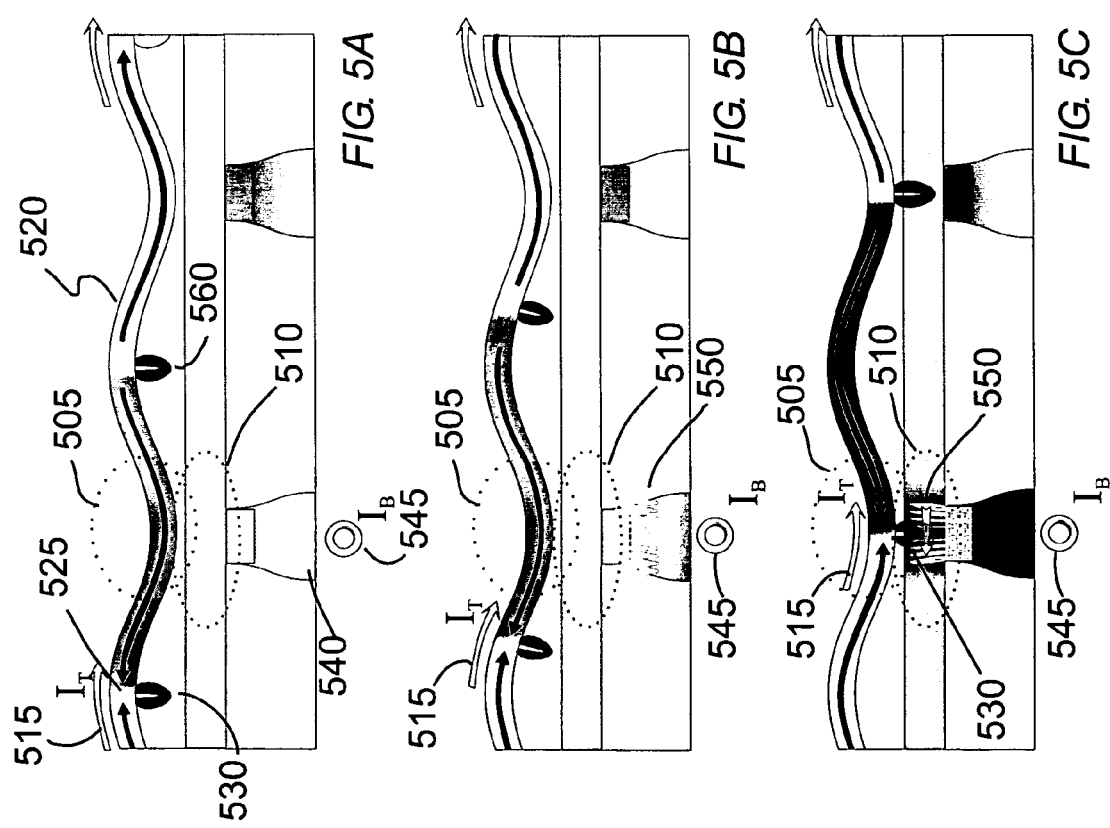

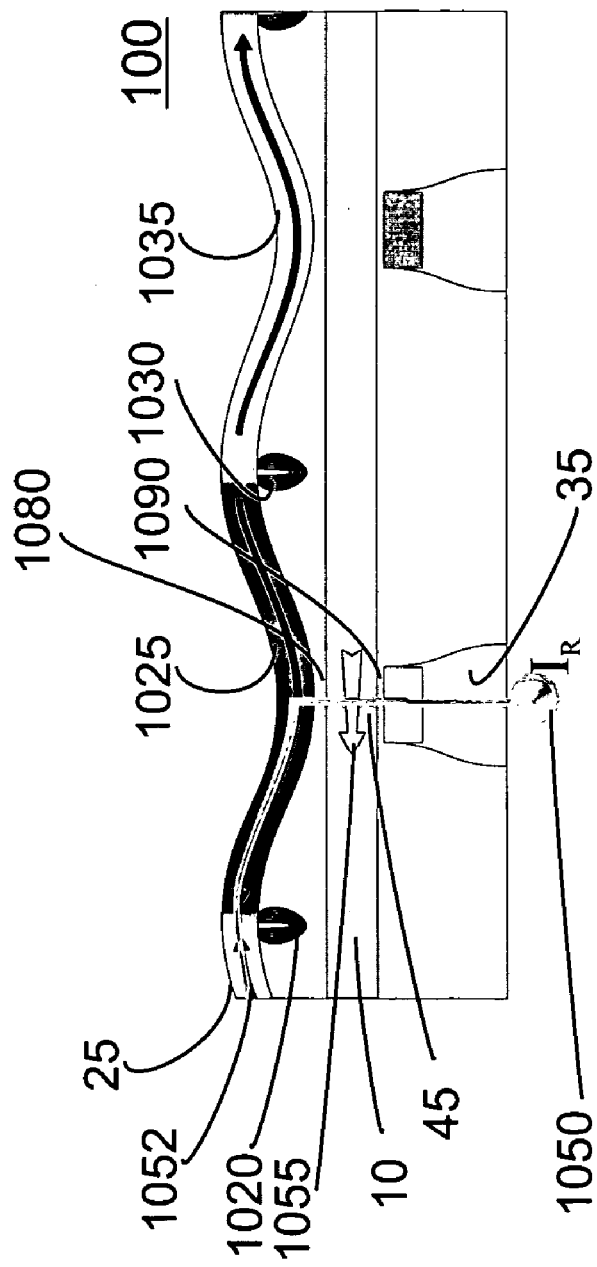
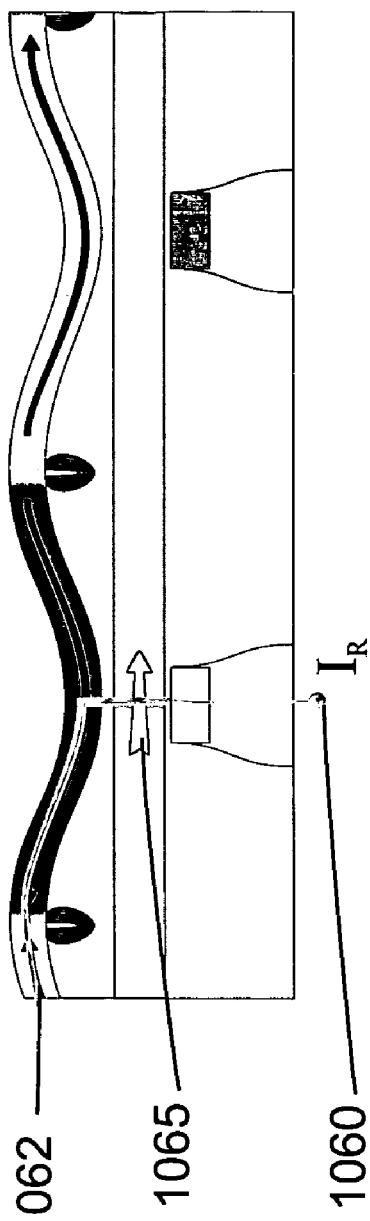
FIG. 10A
FIG. 10B

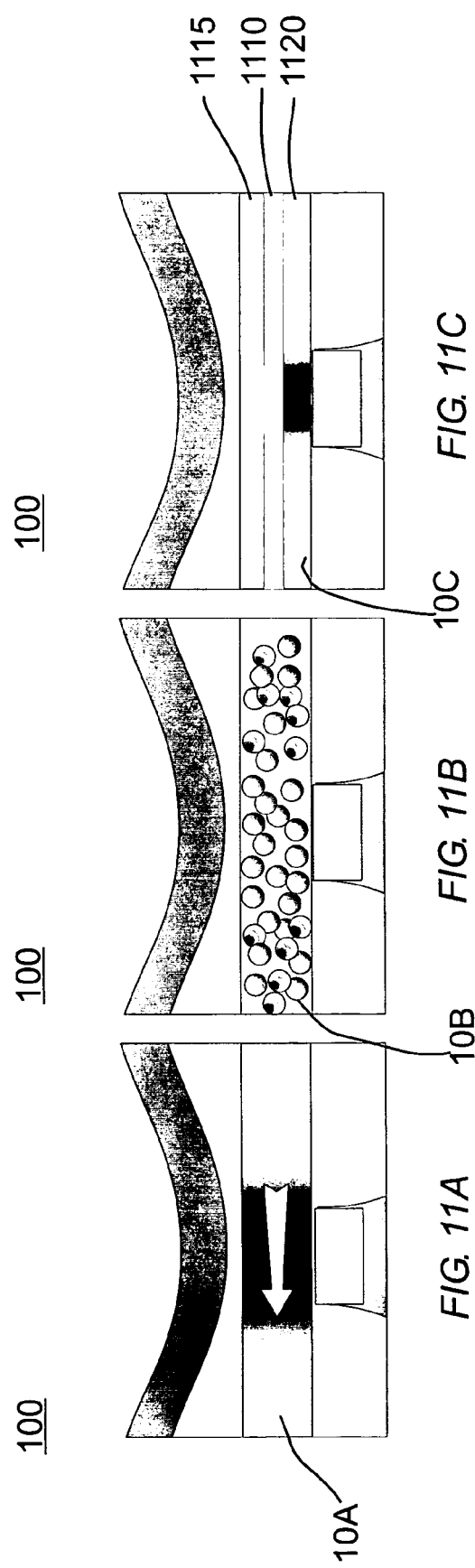

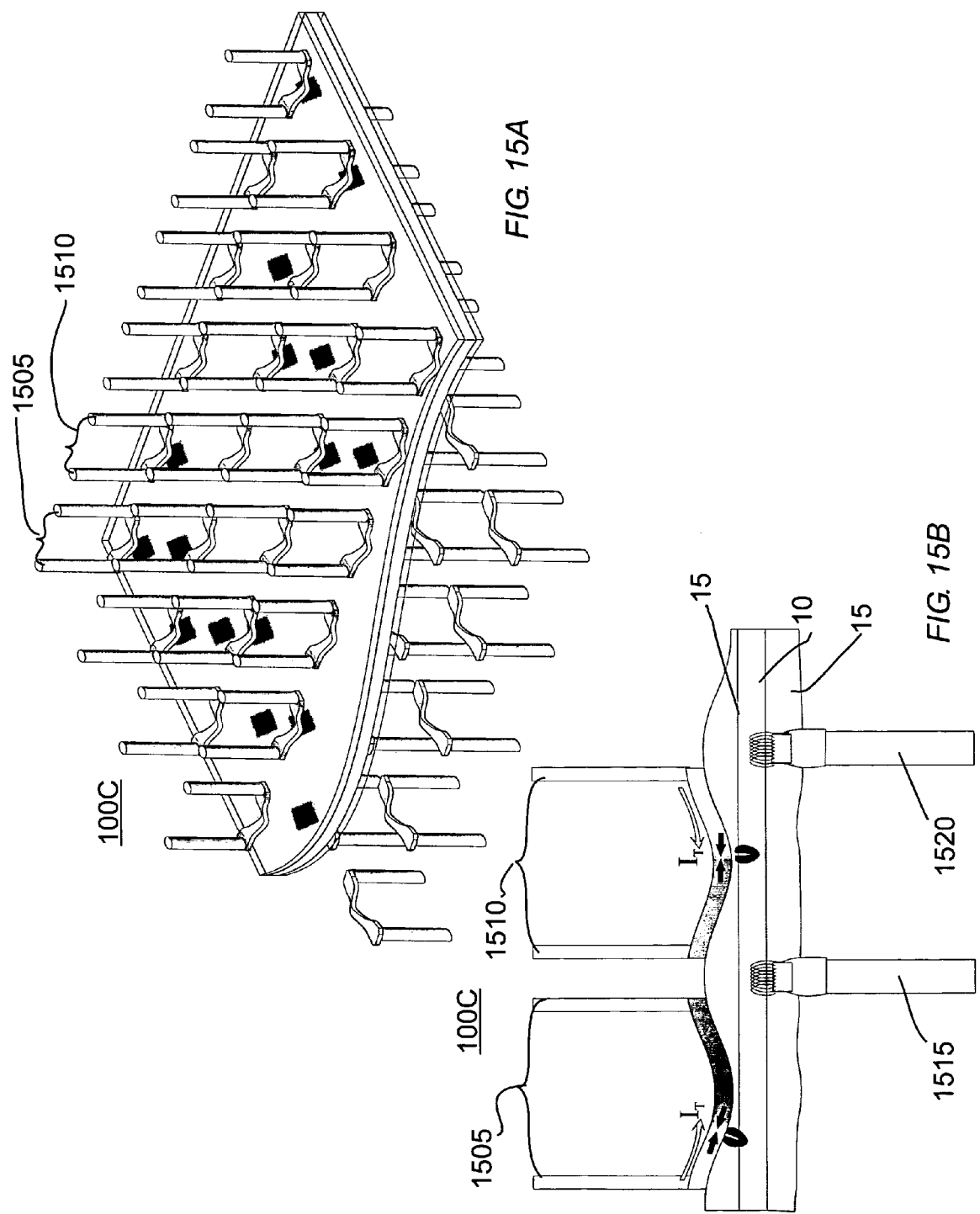

SYSTEM AND METHOD FOR STORING DATA IN AN UNPATTERNED, CONTINUOUS MAGNETIC LAYER

CROSS-REFERENCE TO RELATED APPLICATIONS

The present application is related to co-pending U.S. patent applications Ser. No. 10/458,554, titled "Shiftable Magnetic Shift Register and Method of Using the Same," and Ser. No. 10/458,147, titled "System and Method for Writing to a Magnetic Shift Register," both of which were filed on Jun. 10, 2003, and are incorporated herein by reference in their entirety.

FIELD OF THE INVENTION

The present invention generally relates to memory storage systems, and particularly to a memory storage system that uses the magnetic moment of magnetic domains to store data. Specifically, the present invention relates to a system that stores data in an unpatterned, continuous magnetic layer.

BACKGROUND OF THE INVENTION

There is great interest today in magnetic random access memory (MRAM) as a high performance, non-volatile memory using magnetic tunnel junction (MTJ) memory elements. The magnetic tunneling junction comprises two layers of ferromagnetic material separated by a thin insulating material. The direction of the magnetic moment of one of the layers is fixed, for example, by exchange bias with an antiferromagnetic material as described in U.S. Pat. No. 5,650,958, or by forming this layer from a ferromagnetic material with a large magnetic anisotropy, much higher than that of the second ferromagnetic layer, as described in U.S. Pat. Nos. 5,801,984 and 5,936,293.

The magnetic moment of this first layer responds very little to the magnetic fields which are applied during the operation of the memory device. By contrast, in the second ferromagnetic layer, the magnetic moment direction is allowed to move in response to magnetic fields which are applied during the operation of the memory device to set the direction of the magnetic moment of this layer. This applied field is referred to as the writing field or switching field.

It is advantageous if the magnetization of both the first and second ferromagnetic layers are largely homogeneous and aligned along one particular direction so that the magnetic moments form essentially a single magnetic domain. Usually the magnetic moment will not be homogeneous but, especially at the edges of the device where the demagnetization fields are largest, the magnetization may be directed away from the preferred direction.

Nevertheless, the direction of the magnetic moment in the second layer will largely either be parallel or anti-parallel to the first layer, thereby allowing the storage of data in the form of "ones" and "zeros". The individual MTJs are generally formed by micro-lithographically patterning a continuous film comprised of the magnetic tunnel junction structure, and thereby defining an MTJ element with a particular shape and area. To create the MRAM the MTJ elements are incorporated within a network of "write" and "bit" lines for the purpose of reading and writing the MTJ devices as described in U.S. Pat. No. 5,640,343.

Electrical circuits for setting and interrogating the state of the individual MTJ elements may be formed by conventional CMOS processes. During the fabrication of the MRAM chip the MTJ elements will generally be fabricated by first depositing a continuous magnetic multi-layered film comprised of the magnetic tunnel junction structure on top of the array of write (or bit) lines which have been fabricated in a prior step. The MTJ film is then patterned using an etching technique to form the ultra-small tunneling junctions of a particular shape and size.

One of the major problems with MRAM using MJTs is scaling the MTJ elements to very small sizes. The switching fields of these elements become ever more sensitive to the detailed structure of the edges of these devices as the devices become smaller. Small variations in shapes and sizes of the MTJs and edge roughness of these devices cause large changes in the magnitude of field required for writing the individual device. Moreover, the field required to change the state of the MTJ memory element increases as the size of these elements decreases.

The magnetostatic fields emanating from the magnetic poles at the edges of the MTJ memory elements primarily determine the required magnitude of the writing or switching fields. The structure of the MTJ device can be made more complex to alleviate the role of the demagnetizing fields, for example, by forming one or both of the ferromagnetic layers comprising the MTJ from sandwiches of two or more ferromagnetic layers separated by thin non-ferromagnetic layers, as described in U.S. Pat. Nos. 5,841,692, 6,153,320, and 6,166,948.

In conventional MRAM cross-point architectures, the state of the storage elements is changed by passing currents through parallel arrays of "write-line" and "bit-line" wires near the MTJ memory elements. Typically, local fields at individual MTJ storage elements are created by passing electrical currents through two wires placed just above and just below the MTJ element.

An MTJ element is placed at the "cross-point" of each of the write and bit line wires. The write-line and bit-line wires are typically arranged to be orthogonal to one another with the MTJ element oriented with its easy magnetic axis oriented along one of the wires, usually referred to as the bit-line, although the MTJ device may also be oriented at some other angle with respect to the direction of the wires. A series of MTJ storage elements is arranged along each of the write and bit wires.

One selected element, at the cross-point of one of the bit-lines and one of the write-lines, is written by passing currents simultaneously along these wires. Along these same wires there will be a number of half-selected elements which are subjected to either the write-line field or the bit-line field.

The maximum fields that can be generated by the currents passing along the write and bit-line wires is limited to about 100 Oe for reasonable current densities (or perhaps twice this amount if the wires are clad with a highly permeable soft ferromagnetic material such as permalloy). The maximum current is limited ultimately by electro-migration whereby atoms in the wires can be moved by current passing through the wire which can eventually lead to failure of the wire due typically to local necking of the wire which results in an increase in the local current density leading to a runaway process.

Thus, in actual devices the current density must be below this limit, but, even under these circumstances, the current density will be limited by other considerations, including requirements on power dissipation and the size of power transistors on the chip. Constraints on these currents thereby constrain the maximum field and so limit the smallest size of the MTJ elements.

The switching field can be decreased by reducing the net magnetic moment of the element, for example, by using magnetic material with smaller magnetization values or by using less magnetic material. Less magnetic material can be used by reducing the thickness of the magnetic layers in the MTJ device. However, these devices then become susceptible to thermal upsets due to the super-paramagnetic effect. Consequently, the MTJ elements must have sufficient magnetic anisotropy that they are stable against thermal fluctuations at the operating temperature of the MRAM device and, particularly, when these devices are half-selected during writing of elements in the MRAM cross-point architecture.

What is therefore needed is an MRAM architecture in which the switching of the memory elements is not determined by the shape and size of the memory elements, and in which much larger local magnetic fields can be generated, allowing smaller magnetic elements with sufficient magnetic stability against thermal fluctuations. The need for such a system has heretofore remained unsatisfied.

SUMMARY OF THE INVENTION

The present invention satisfies this need, and presents a system and an associated method (collectively referred to herein as "the system" or "the present system") for storing digital information in an un-patterned magnetic film, the data storage layer, in a solid state device with no moving parts. The present system provides a global method for writing to and reading from an unpatterned magnetic film. Briefly, the present system uses the inherent, natural properties of the domain walls in ferromagnetic or ferrimagnetic materials to write data on an un-patterned magnetic film. Data is read from the unpatterned magnetic film using magnetic tunneling junctions (MTJs). The magnetic film is the storage layer. The magnetic film may be a single continuous layer within which multiple data bits are stored or may be a series of discontinuous sections which are not contiguous with one another.

The magnetic film may be comprised of a single magnetic layer or may be comprised of multiple magnetic layers which may be separated by non-ferromagnetic spacer layers. This film is comprised of magnetic materials similar to those used in magnetic media in conventional magnetic hard disk drives. These magnetic materials have sufficient intrinsic crystalline magnetic anisotropy that magnetic regions or bits written into this layer are stable against thermal fluctuations. This means that the magnetic fields required to change the orientation of these magnetic regions or bits will be much larger than can be provided by currents passing through near-by wires. These larger magnetic fields, however, can be achieved by using the domain wall fringing field generated at the boundary between two magnetic domain walls in magnetic tracks comprised of magnetic wires located in proximity to the magnetic film.

Associated with each domain wall are large magnetic fringing fields. The domain wall concentrates the change in magnetism from one direction to another in a magnetic material in a very small space. Depending on the nature of the domain wall, very large dipolar fringing fields can emanate from the domain wall. This characteristic of magnetic domains is used to write to data storage regions in the magnetic film. When the domain wall is moved close to the magnetic film, the data storage layer, the large fields of the domain wall change the direction of the magnetic moment in a localized storage region within the storage layer, effectively "writing" a bit to the storage layer.

An important characteristic of domain wall fringing fields is that they are localized in small regions of space near the domain wall. Thus, domain wall fringing fields can provide highly localized and large magnetic fields that can be manipulated in space by moving or controlling the position of the domain wall within a magnetic entity such as a magnetic track or wire.

The fields created by the domain wall are large enough to write to magnetic layers with magnetic switching fields of several thousand oersteds. The magnitude of the fringing fields drops rapidly with distance from the domain wall. Consequently, application of the domain wall fringing fields can be controlled in magnetic tracks or wires located in proximity to the magnetic film, by varying the distance of the wire from the material whose property is to be changed by the domain wall fringing field, and by moving the domain wall along the wire.

In the present system, the magnetic storage regions within the storage layer are written by using the fringing fields from magnetic domain walls in neighboring magnetic tracks comprised of magnetic wires. These wires are brought close to the magnetic storage layer where the magnetic storage regions are to be written. In the quiescent state, the domains may be parked away from the storage layer in the wire sufficiently far from the surface of the storage layer that the fringing field may not influence the state of the storage layer.

The domain walls are moved in this wire from one side of the magnetic region, across the magnetic region (and close to this region) to the other side of the wire for writing the magnetic region. The current flowing through the wire controls the movement of the domain wall, and consequently controls the writing of the magnetic regions within the magnetic storage layer.

In one embodiment, each magnetic region within the storage layer has an associated magnetic wire which is connected to a transistor so that an individual magnetic region is switched by passing a current through the associated magnetic wire to move the corresponding domain wall and its associated magnetic fringing field. Consequently, the magnetic region is written. Depending on which direction the domain wall is moved (left to right or right to left) the magnetic region is written in one direction or the other.

In another embodiment the magnetic wires associated with each magnetic storage region are connected together in series such that domain walls associated with each magnetic region are moved together across the storage region. By having magnetic wires above and below the storage layer a selected magnetic region is written by a combination of domain wall fringing fields from the wires above and below the chosen magnetic region. The half-selected regions are not written.

The magnetic film or data storage layer can be continuous, or, alternatively, it can be comprised of smaller magnetic sections that are not contiguous with one another. These smaller magnetic sections can vary in size, from sections that are so small that they contain only one (or a small number of data storage regions), or they can be large enough to contain a series of magnetic data storage regions associated with one or more writing tracks.

In a preferred embodiment, the magnetic section is sufficiently large such that the data storage region (or regions) does not extend to the edges or the boundary of the magnetic section, so that the detailed morphology and shape of the edges of the section do not influence the magnitude of the magnetic fields required to write the magnetic region or regions within the section. As a result, the individual data storage regions are not "patterned" into special areas with particular shapes as in conventional MRAM architectures, but they rather reside in an "un-patterned" magnetic film or data storage layer. Similarly, the data storage regions are not localized in small nano-patterned magnetic elements of a particular shape and size, but they are rather simply regions within an un-patterned, and otherwise homogeneous magnetic film. The locations of the magnetic regions within the magnetic film are conveniently determined by the writing element.

One advantage of this invention compared to conventional MRAM designs is that the field required to write the magnetic regions in the unpatterned magnetic data storage layer is influenced only by the magnetic properties of this layer and not by the detailed physical structure of a nano-patterned magnetic element. Furthermore, the use of domain wall fringing fields in magnetic writing elements may allow much higher local magnetic fields than are possible to generate from electrical currents passing through non-magnetic wires. This allows for an MRAM that can achieve much higher densities than is possible with conventional cross-point designs.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 2 is comprised of FIGS. 2A, 2B, and 2C, and schematically illustrates expanded views of one data bit and its corresponding writing and reading structure as utilized by the magnetic memory device of FIG. 1;

FIG. 5 is comprised of FIGS. 5A, 5B, 5C, 5D, 5E, and 5F, and illustrates the process of writing to the magnetic memory device of FIG. 1;

FIG. 10 is comprised of FIGS. 10A and 10B, and illustrates the process of reading data from the magnetic memory device of FIG. 1;

FIG. 11 is comprised of FIGS. 11A, 11B, and 11C, and illustrates different materials that can be used in the magnetic film of the magnetic memory device of FIG. 1;

FIG. 15 is comprised of FIGS. 15A and 15B, and illustrates another embodiment of the magnetic memory device of FIG. 13.

DETAILED DESCRIPTION OF PREFERRED EMBODIMENTS

Figure 1B:
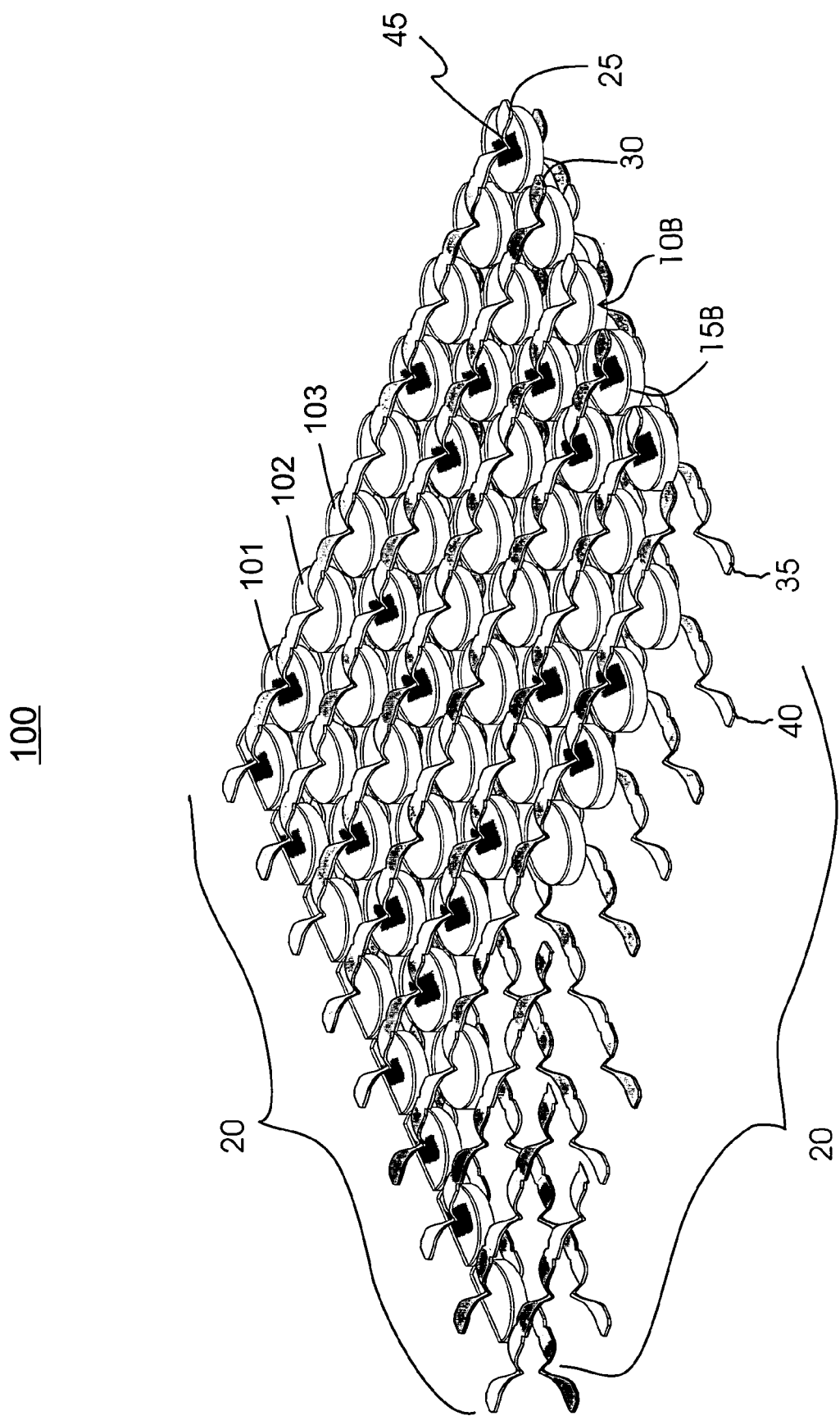
FIG. 1 is comprised of FIGS. 1A, 1B, 1C, 1D, and 1E, and illustrates various embodiments of a magnetic memory device according to the present invention.

Conventional MRAM architectures involve the use of discrete magnetic memory elements with a particular shape and size that are lithographically patterned by, for example, conventional optical and/or electron beam lithography and etching. Typically, these memory elements are fabricated on top of micro-electronic components, such as transistors and capacitors, which form circuits which are used for the purposes of reading, writing and interrogating the magnetic memory elements.

These components are formed first, typically on silicon wafers, and then the magnetic memory elements are fabricated, usually by first depositing a continuous film across the wafer which comprises the magnetic memory element. The film is then lithographically patterned into magnetic memory devices of a particular and well defined shape and size which are aligned very precisely with wires or vias which connect these elements to the underlying electronic components.

Finally, vias and wires are fabricated on top of the patterned magnetic memory elements to provide the final electrical connections to these elements. Typically, the performance of the magnetic memory is very sensitive to the detailed shape and size of the magnetic memory elements and to their precise placement with respect to the circuitry above and below these elements. Thus, the shape and size of the elements must be very well controlled. This becomes increasingly difficult as the size of the elements is shrunk to allow for ever high memory storage capacities.

FIG. 1A illustrates an exemplary high-level architecture of a magnetic memory device 100 comprising an unpatterned, continuous magnetic film 10A. The magnetic data storage layer 10A is unstructured and does not specify the location of each data bit, allowing very dense writing of data to this magnetic film.

As used herein, the term "patterned" indicates that the storage layer is comprised of a series of sections, each of which is sufficiently large to accommodate at least one data bit that comprises a magnetic region within the magnetic storage layer. In addition, each section is sufficiently large that the edges of this section do not significantly influence the writing of data bits to be stored therein.

The term "un-patterned" generally indicates that the storage layer is contiguous over the array of storage data bits. Patterned regions are sections that can be of any desirable shape, such as circular, elliptical, rectangular, square, or trapezoidal. Patterned sections can also be large enough to comprise one or more rows or columns of data bits.

The magnetic memory device 100 utilizes a series of writing devices (also referred to herein as writing element) 20. The writing device 20 is comprised of many tracks made of individual magnetic wires, represented by magnetic tracks such as tracks 25, 30, 35, 40. The tracks are comprised of magnetic domains wherein the magnetization alternates from one direction of magnetization to the opposite direction preferably along the tracks from one domain to the next. For purposes of illustration only, the magnetic domains in neighboring tracks are shown to be oppositely magnetized in FIG. 1A but in operation the orientation of magnetic domains from one track to the next track need not be correlated and may vary depending on the history of the writing element.

In FIG. 1A, the writing device 20 is situated both above and below the plane of the magnetic film 10A. For simplicity of reference, exemplary tracks 25 and 30 are also referred to herein as upper tracks because they are located above the plane of the magnetic film 10A. Similarly, exemplary tracks 35 and 40 are also referred to herein as lower tracks because they are located below the plane of the magnetic film 10A. It should be clear that the terms "upper" and "lower" are not used herein as limiting terms but rather for illustration purposes only.

In this exemplary embodiment, tracks 25, 30, 35, and 40 are formed such that arch-like bends in the wire almost touch the magnetic film 10A. Data is written into each data bit represented by data bit 45 where the arch-like bend of a track above the magnetic film coincides with an arch-like bend in a track below the magnetic film.

The magnetic film 10A is coated with a thin insulating layer 15A on its top surface and a generally similar, thin insulating layer on its bottom surface. Preferably one or otherwise both of these insulating layers may form the tunnel barrier component of a magnetic tunnel junction for the purpose of reading the state of the data bits in the layer 10A.

An insulating material surrounds the magnetic film 10A and the writing element 20, and is made during the process of fabricating the magnetic film 10 and the writing element 20, to form a solid state memory device.

When a current is passed through a ferromagnetic metal, the current, which is comprised of spin-up and spin-down electrons, becomes spin-polarized because the electrical conductivity of the spin-up and spin-down electrons can be quite different in magnetic metals. When spin polarized electrons (which, by definition travel in the opposite direction to the current) are passed from a first side of a magnetic domain wall to its other side, the current becomes spin polarized in a direction along the direction of magnetization on the first side of the domain wall.

The spin polarized electrons then deliver spin-angular momentum to the oppositely magnetized material on the second side of the wall which causes the magnetic moment on the second side of the wall to rotate, thereby inducing the magnetic domain wall to move in the direction of the spin polarized electrons, i.e., in the opposite direction to the current direction, for majority spin-polarized electrons. When the current is passed in the reverse direction the domain walls will also move in the opposite direction.

As current is passed along the tracks (i.e., track 25 and track 35) of the writing device 20, the domains in the tracks are moved to the left or to the right, depending on the direction of the current. As the domains move, the fringing fields from the domain walls write to the magnetic film 10A. Along the tracks, each of the fringing fields associated with each domain wall may be writing. However, the field of the fringing fields is chosen such that data is not written to a data bit 45 unless the fringing field in the upper track 25 is combined with the fringing field in the lower track 35 applied to the same data bit 45.

In FIG. 1A, the tracks are shown with a series of domain walls regularly spaced along the tracks with the domain walls formed at the boundaries between regions of the tracks magnetized in opposite directions along the track. It should be understood that the domain walls do not necessarily need to be regularly spaced apart. In FIG. 1A, the domain walls are shown in their quiescent state so that they are not writing to the magnetic storage film.

The operation of the writing device 20 is illustrated by the detailed drawings in FIG. 2 (FIGS. 2A, 2B, 2C). The writing device 20 is comprised of ferromagnetic tracks or wires such as wire 25 and wire 35 that are placed in proximity to the magnetic film 10A. The wire 25 and wire 35 are brought in closer proximity to the film 10A by the arch-like bends in the wires.

As illustrated for exemplary purposes, the ferromagnetic track 25 is comprised of a plurality of successive domains, such as exemplary domains 205 and 210, magnetized in opposite directions. Ferromagnetic track 35 is comprised of a plurality of successive domains 215, 220, also magnetized in opposite directions along the track. These magnetic domains, 205 and 210, and, 215 and 220, define domain walls 225 and 230, there between.

The magnetization directions of the domains 205 and 210, and, 215 and 220 are set during an initialization of the memory device. The initialization stage needs to be carried out only once, after the memory has been fabricated and before the operation of the memory device. This is accomplished by the detailed design of the magnetic tracks and by, for example, applying large external magnetic fields in the proper sequence.

The initial state of the tracks can also be established by injecting magnetic domains from the ends of the tracks, for example, from magnetic regions whose magnetization can readily be rotated from one direction to the other in magnetic fields smaller than those which are required to change the magnetic state of the tracks themselves. These magnetic regions may, for example, be wider than the tracks since the magnetic switching field of narrow magnetic wires or regions decreases approximately inversely with their width.

Once a magnetic domain is injected into the wire the domain may be moved along a track or wire by passing a current pulse into the wire. By using a sequence of domain wall injection and current pulse induced domain wall motion, a sequence of domain walls can be established along each track. Once the magnetic domains have been set up in the tracks, they are subsequently moved only by passing currents through the tracks for the purposes of writing data bits to the magnetic storage film.

With specific reference to FIG. 2B, a first domain wall 225 is associated with fringing field 235, and a second domain wall 230 is associated with fringing field 240. When both of the domain walls 225 and.230 of the writing device 20 pass the region (also referred to as data region) closest to the magnetic film 10A, the large magnetic field emanating from the domain wall 225 in conjunction with that emanating from the magnetic domain wall 230 of the writing device 20 are combined to enable the writing of a data bit, in the data region, within the magnetic storage film 10A.

To write to the magnetic storage film 10A, the writing device 20 selectively changes the direction of the magnetic moment of a data bit 45 in the magnetic film 10A. In the present illustration, the magnitudes of the fringing fields 235 and 240, applied to the magnetic storage film 10A, decrease rapidly outside the region around the respective domain walls 225 and 230, either in the writing device 20 or the magnetic film 10A.

Thus, the magnetic fringing field associated with the domain walls 225 and 230 can be used to provide a highly localized and large magnetic field to the magnetic storage film 10A, allowing the writing of a small magnetic region 45 within the magnetic film 10A. The magnitude of the fringing field 235 and 240 applied by the writing device 20 to the magnetic film 10A can be controlled by controlling the relative location of the domain walls 225 and 230 in the writing device 20.

In addition, the location of the domain wall 225 is controlled by applying a current 250 along track 25. Similarly, the location of the domain wall 230 is controlled by applying a current 255 along track 35.

As shown in FIG. 2C, the domain walls 225 and 230 are moved away from the magnetic bit 45 by currents 250 and 255, respectively, after the bit is written. The tracks 25 and 35, as shown in FIGS. 2A and 2C, have notches on either side of the arch shaped regions in these tracks for the purposes of fixing the position of the domain walls when they are not being used for writing.

During the write operation, current pulses, such as pulses 250 and 255, are applied to the respective tracks 25 and 35 of sufficient magnitude and temporal duration that the corresponding domain walls 235 and 240 are moved from one notched position on one side of the arched shaped region to a second notched position on the other side of the arched shaped region.

During the motion of the domain walls between the notched positions the domain walls and their associated magnetic fringing fields are brought close to the magnetic storage film so that the magnetic storage film is subjected to a large and localized magnetic field sufficient to set the magnetization direction of the small magnetic region in one direction or the opposite direction and so write a magnetic bit.

In FIG. 2, the writing of the magnetic region 45 in the magnetic film 10A is accomplished by the combination of the magnetic fringing fields from the domain wall in the track 25 above the storage film 10A and that from the track 35 below the storage layer 10A.

In another embodiment of this invention writing is accomplished by the magnetic fringing field from only one domain wall from a single track either above or below the magnetic storage film 10A.

In FIG. 1A, the magnetic film 10A is shown as a continuous and un-patterned magnetic film. However, in other embodiments, illustrated, for example, in FIGS. 1B through 1E, the magnetic films 10B through 10E, respectively, are comprised of multiple sections of magnetic material each distinct from one another.

For example, as illustrated in FIG. 1B, the magnetic film 10B is comprised of a series of approximately circularly (or elliptically) shaped sections, i.e., 101, 102, 103, wherein a single data bit may be selectively written. These sections 101, 102, 103, are distributed along, and aligned with, each "column" and "row" of writing devices within the writing element 20.

These sections 101, 102, 103 are sufficiently large to contain only one magnetic bit so that each data bit shown in FIG. 1A is contained within one section of the magnetic film. The magnetic bit does not extend to the very edges of the magnetic sections, so that the writing fields required to write the bit are not affected by the detailed shape and morphology of the edges of the sections 101, 102, 103. Thus, the magnetic sections 101, 102, 103 do not need to be precisely aligned with the corresponding upper and lower magnetic tracks associated with each section, making the fabrication of the memory device much simpler, easier, and less expensive than comparable devices.

In the embodiment illustrated herein, a series of insulating layers 15B, correspond in shape to, and are formed on, the sections 101, 102, 103. However, the layer 15B may also extend beyond the edges of the magnetic sections 101, 102, 103, and may also be continuous, extending from one section to another section.

This extent of the layer 15B depends on the detailed method of fabrication of the magnetic memory device 100. Furthermore, the layer 15B does not need to be precisely aligned with the magnetic film sections 101, 102, 103. The layer 15B needs only cover the middle portion of the magnetic sections 101, 102, 103 that touch the upper magnetic tracks 25, 30, to form a tunneling barrier for reading purposes.

A similar insulating layer may optionally coats the underside of the sections 101, 102, 103. This optional insulating layer may also form a tunneling barrier layer within a magnetic tunnel junction reading device. However, because the sections 101, 102, 103 contain a single data bit and intersect with only one upper track and one lower track, the lower track may be in electrical contact with the magnetic section and no isolation layer between the magnetic section and the lower track is needed.

Figure 1C:
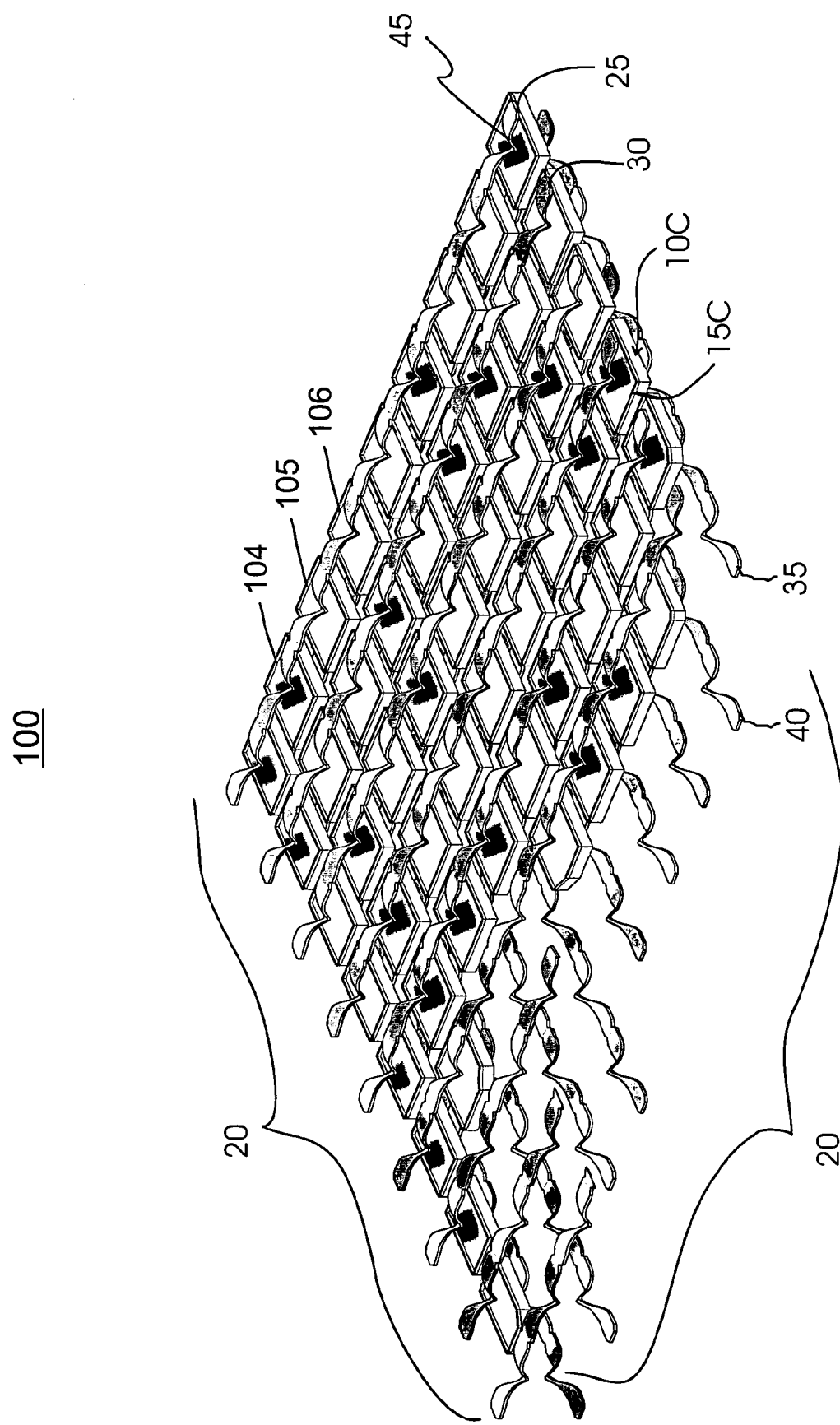

FIG. 1C illustrates another embodiment of the writing device 20, wherein the magnetic film 10C is comprised of a series of approximately rectangularly (alternatively square, triangular, or any other suitable) shaped sections, i.e., 104, 105, 106, wherein a single data bit may be selectively written. These sections 104, 105, 106 are distributed along and aligned with each "column" and "row" of writing devices within the writing element 20. In this embodiment, a series of insulating layers 15C, correspond in shape to, and are formed on, the sections 104, 105, 106.

Similarly to the layout described earlier in connection with FIG. 1B, the layer 15C may be limited in extent to a region where the upper tracks 25, 30 come in proximity to the magnetic sections, 104, 105, 106. Alternatively, the layer 15C may be contiguous between magnetic sections. A corresponding thin insulating layer may, optionally, be disposed on the underside of the magnetic sections 104, 105, 106.

FIG. 1D illustrates another embodiment of the writing device 20, wherein the magnetic film 10D is comprised of a series of columns, i.e., 107, 108, 109. In this embodiment, a series of insulating layers 15D, correspond in shape to, and are formed on, the sections 107, 108, 109.

Figure 1E:
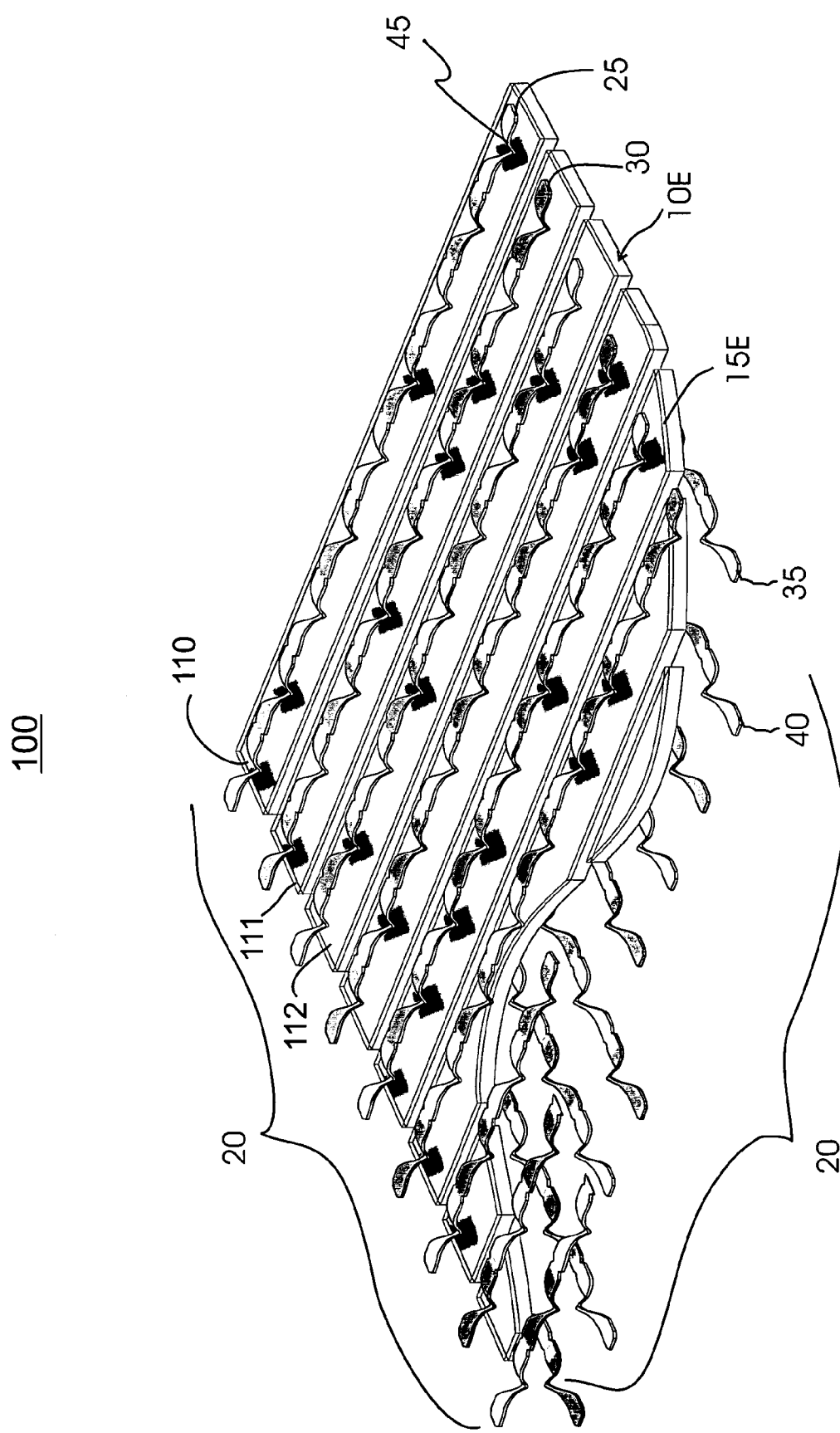

FIG. 1E illustrates another embodiment of the writing device 20, wherein the magnetic film 10E is comprised of a series of columns, i.e., 110, 111, 112. In this embodiment, a series of insulating layers 15E, correspond in shape to, and are formed on, the sections 110, 111, 112.

In both the embodiments shown in FIGS. 1D and 1E the corresponding insulating layers 15D and 15E may, on the one hand, be limited in lateral extent to the region of close proximity of the upper tracks and the magnetic film or may, on the other hand, be contiguous between neighboring tracks. Similarly, there may or may not be a thin insulating layer on the lower surface of the corresponding magnetic sections.

Regardless of how the magnetic film 10 is comprised of smaller magnetic sections, the sections are sufficiently large that they behave like an un-patterned magnetic film to the individual magnetic bits. Thus, the peripheral region of the magnetic section, i.e., the detailed shape and morphology of the edges of the section, do not influence the writing of the individual magnetic bits, contrary to the case of conventional MRAMs with individual patterned magnetic storage bits.

Figure 3A:
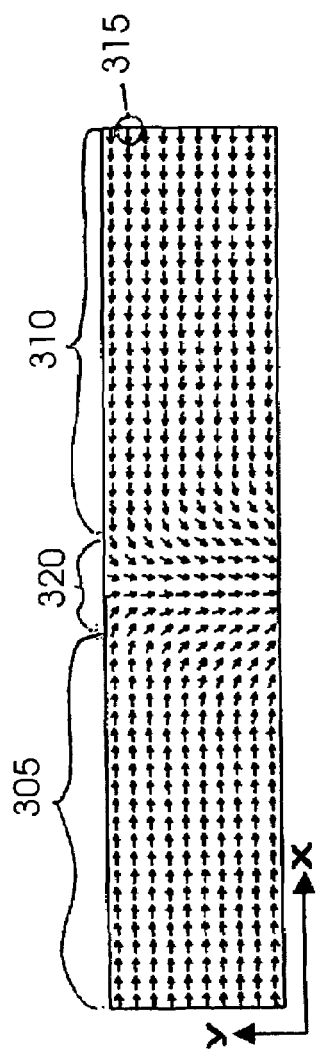
FIG. 3 is comprised of FIGS. 3A, 3B, and 3C, and represents a schematic diagram and two graphs illustrating domain wall fringing fields of the magnetic memory device of FIG. 1.
Figure 3C:
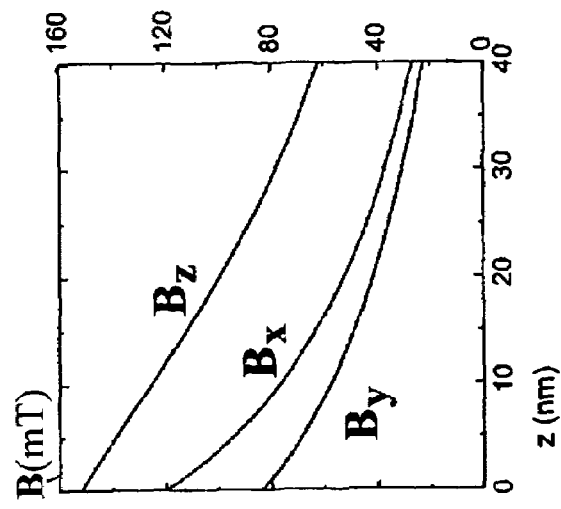
Figure 3B:
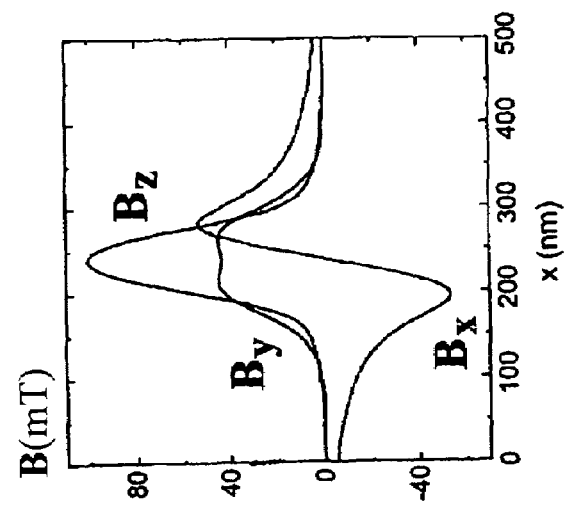

FIG. 3 (FIGS. 3A, 3B, 3C) illustrates the concept of domains, domain walls, and fringing fields, as used in conjunction with the present invention. FIG. 3A shows an exemplary layer of a magnetic material, with which the tracks of the writing element 20 are comprised, with two magnetic domains 305 and 310 with their magnetizations directed along opposite directions along the x axis.

The arrows, such as arrow 315, represent a magnetic moment, or dipole, and indicate local magnetization directions. The magnetic moments in domain 305 point to the right, while the magnetic moments in domain 310 point to the left. The domain wall 320 is the region in which domains 310, 305 of opposite polarity meet. The change of magnetization between domain 305 and domain 310 is concentrated in the small region or domain wall 320, creating a large dipolar fringing field emanating from the surface of the layer.

The relative magnitude of an exemplary fringing field B is shown in FIG. 3B. The fringing field B is localized and concentrated over a region of, for example approximately 100 nm, in the x dimension. The peak values of the components Bx, By, and Bz of the fringing field B are illustrated in FIG. 3C as a function of out-of-plane distance. The fringing field is also localized in the z direction, and is concentrated primarily in a region of approximately 20 nm in the z direction.

These fringing field components Bx, By, and Bz are very high in the region of the domain wall 320, and drop off rapidly with distance from the domain wall 320. Consequently, the fringing field B is localized and sufficiently large for use to magnetize a second magnetic material in a small localized region.

The detailed magnitude and spatial variation of the components of the fringing field B depend on the details of the spatial variation of the magnetization in the domain wall 320. The distribution of the magnetization within the domain wall depends on the magnetic parameters of the magnetic material in the magnetic layer comprising the magnetic tracks of the writing element 20, particularly, the magnetization (magnetic moment per unit volume), the magnetic anisotropy and the strength of the magnetic exchange, as well as the thickness and width of the magnetic layer.

The fringing field B is used to write magnetic regions within the magnetic film 10. When the domain wall 320 is moved close to another magnetic material, the large fringing field B of the domain wall 320 changes the direction of the magnetic moment in this second magnetic material, effectively "writing" to this magnetic material. This domain wall 320 can be moved within the magnetic wire of the magnetic track of the writing element 20 by passing a current through the magnetic material of the magnetic wire that is perpendicular to the domain wall 320.

The magnetic moment direction of the domains can be either along the direction of the magnetic track or perpendicular to the direction of the magnetic track of the writing element 20. For very narrow tracks, the preferred direction of the magnetic moments are along the track direction.

Figure 4:
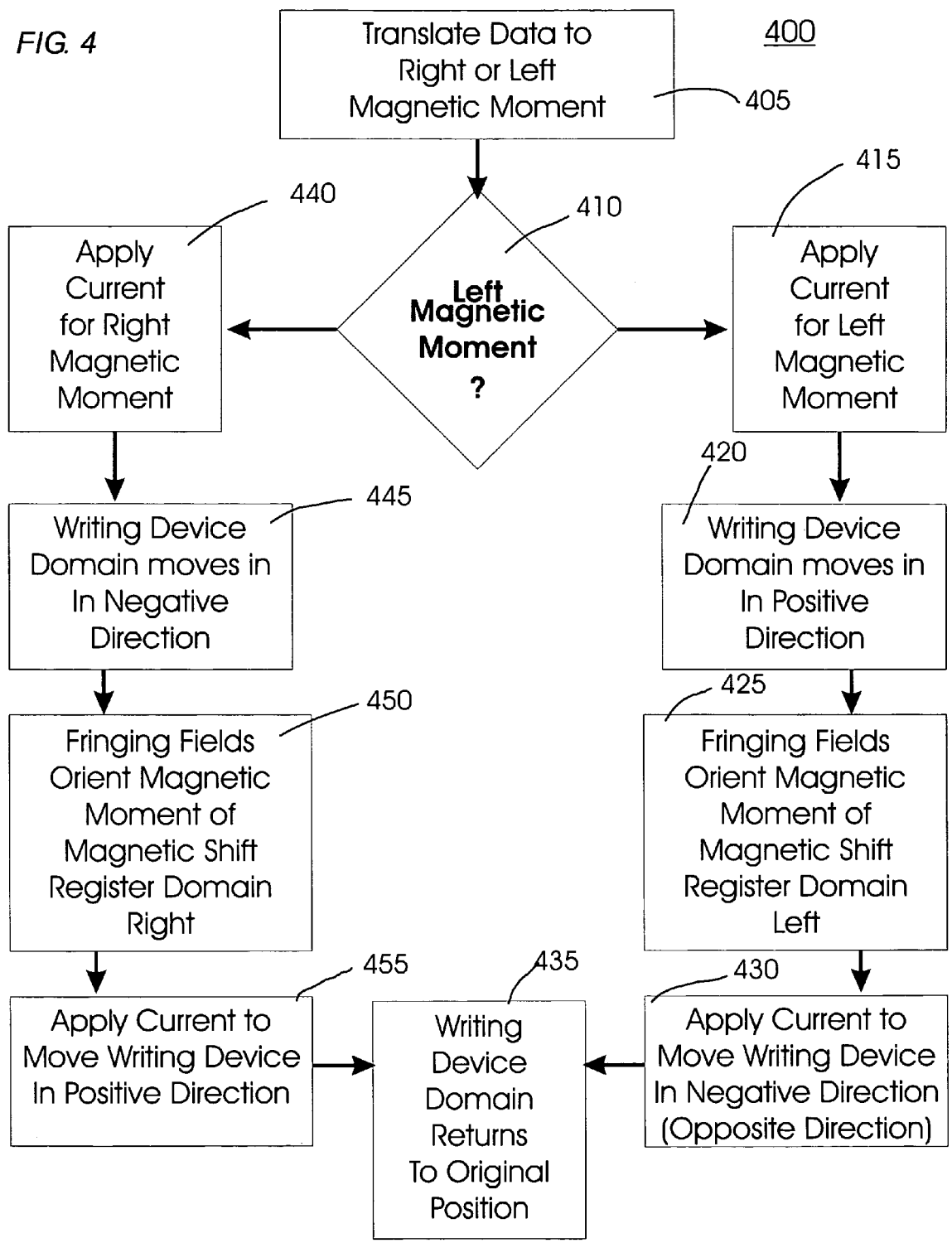
FIG. 4 is a process flow chart illustrating a method of operation of writing to the magnetic memory device of FIG. 1.

A method 400 of the writing device for writing data according to the present invention, is illustrated by the process flow chart of FIG. 4, considered in conjunction with FIG. 5 (FIGS. 5A, 5B, 5C). The domain wall and its associated magnetic fringe fields are shown in a quiescent position within the magnetic track outside a write region 505 (FIG. 5A) of the writing device 20 in FIG. 5. A request to write data is received by the memory system.

At block 405 of FIG. 4, the memory system translates the data (0 or 1) into whether the data bit 510 in the magnetic data storage film will receive a magnetic moment pointing right (a right magnetic moment) or a magnetic moment pointing left (a left magnetic moment). If, at decision block 410, the data bit 510 is to be written with a left magnetic moment, method 400 proceeds to block 415.

At block 415, a current 515 is applied to the track 520 of the writing device 20 in FIG. 5A, moving the domain wall 525 in the positive direction (block 420), as noted by the directional arrow of current 515. Track 520 is located above the magnetic film 10. In response to the application of current 515, fringing field 530 is moved to within the write region 505 (FIG. 5C).

FIG. 5B shows the domain wall 525 at an intermediate position between the quiescent position in FIG. 5A and the writing position in FIG. 5C. Concurrently and in a similar manner, a current 545 is applied to a track 540 located below the magnetic film 10, oriented perpendicular to track 520. The end of the arrow for current 545 shows that the current is flowing in the direction into FIG. 5A, 5B, 5C.

At data bit 510, and only at data bit 510, track 520 and track 540 are both in close proximity to the data film 10. A current 545 is applied to track 540, moving the fringing field 550 within the write region 505. The magnetic fringe fields 530 and 550 write to the data bit 510 (block 425), changing the direction of the magnetization of data bit 510 to point in the desired direction.

The currents 515 and 545 are then applied to tracks 520 and 540 (block 430) so that the fringing fields 530 and 550 are removed from the region of the data bit 510. The fringing fields 530, 550 may be returned to their prior position or moved further down their respective tracks 520, 540 (block 435).

The writing device fringing fields 530 and 550 remain in close proximity of the magnetic film 10 for only an instant, or a predetermined period of time, that is sufficient to write to the data bit 510 of the magnetic film 10. The magnitude of fringing fields 530 and 550 that is applied to data bit 510 is large only when the domain walls tracks 520 and 540 are in proximity to the magnetic storage film 10.

If the data bit 510 is to be written with a right magnetic moment at decision block 410, method 400 proceeds to block 440. At block 440, a current 515 is applied to the track 520, as illustrated in FIG. 5D, to cause the domain wall 555 to move in the negative direction (block 445).

A fringing field 560 is shifted within the write region 505 (FIG. 5D). Concurrently and in a similar manner, a current 545 is applied to a track 540 located below the magnetic film 10, oriented perpendicular to track 520. At data bit 510 and only at data bit 510, track 520 and track 540 are both in close proximity to the data film 10.

A current 545 is applied to track 540, moving the fringing field 565 within the write region 505. The tip of the current 545 shows that the current is flowing out of FIG. 5D, 5E, 5F. The magnetic fringe fields 560 and 565 write to the magnetic film 10 (block 450), changing the direction of the magnetization of data bit 510 to point in the right direction. Currents 515 and 545 are then applied to tracks 520 and 540, respectively, and the domains are moved away from the data bit 510 in the positive direction (block 455). The domains are then returned to their original position (block 435).

In another embodiment of the current invention the tracks 520 and 540 in FIG. 5 are fabricated as straight wires without any arch-like bends. This means that the magnetic storage film will always be subjected to large domain wall fringing fields even when the domain walls are in their quiescent position.

In the embodiment shown in FIG. 5, in which magnetic regions are written by a combination of magnetic fringing fields from domains in two tracks, this is acceptable although less desirable than in the embodiment shown in FIG. 5, in which the arch-like bends prevent large fringing fields from impinging on the storage film except during the writing process.

The properties of the magnetic storage film 10 and the writing device 20 are chosen so that the fringing field from a single domain wall is not sufficient to change the magnetization direction of the magnetization within the magnetic storage film.

Figure 6A:
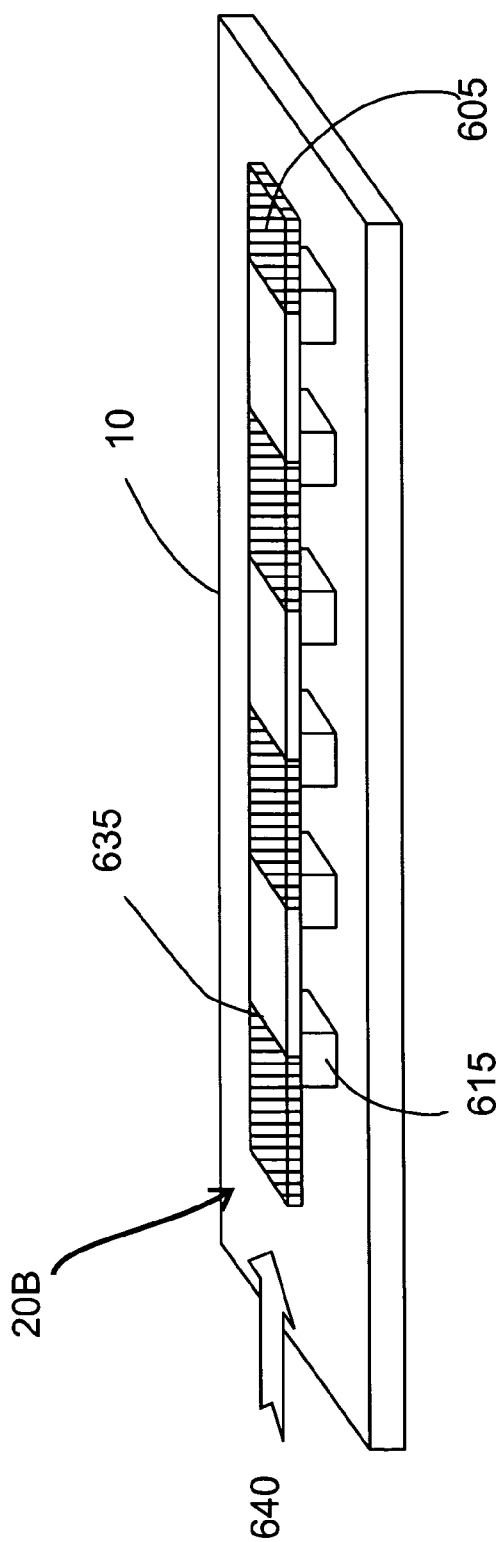
FIG. 6 is comprised of FIGS. 6A and 6B, and represents a configuration of an alternative embodiment of the writing device of the magnetic memory device of FIG. 1, using a block of ferromagnetic or ferrimagnetic material.
Figure 6B:
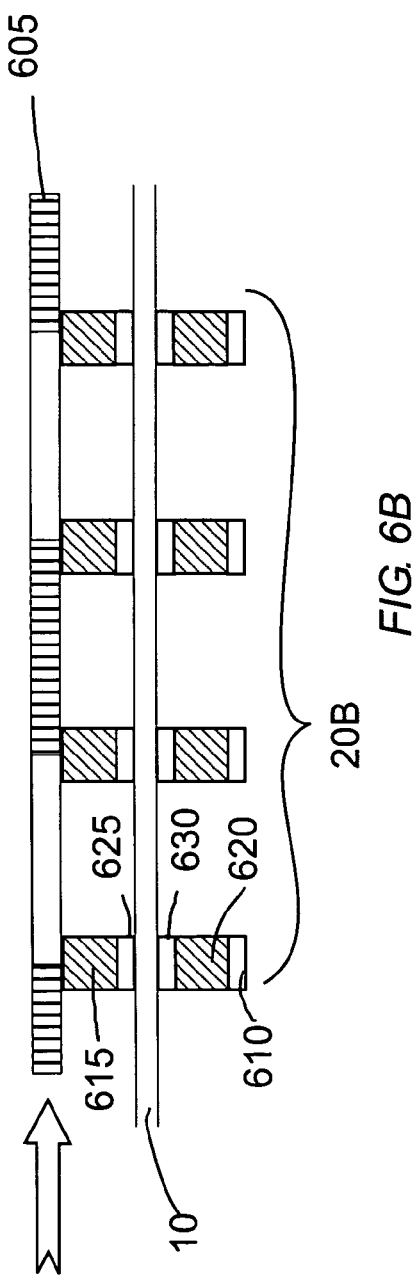

In another embodiment, shown in FIG. 6 (FIGS. 6A, 6B), the arch-shaped bends in each track 605, 610 are replaced with small ferromagnetic blocks 615 and 620. A thin layer 625, 630 is formed on top of the ferromagnetic blocks 615, 620.

The thin layer is used to determine the spacing of the ferromagnetic blocks 615, 620 from the magnetic film 10. Since the writing device should not preferably be in electrical contact with the magnetic film 10, (except possibly when the magnetic film is divided into sections corresponding to one magnetic bit, as shown in FIGS. 1B and 1C) the thin layer 625, 630 may be formed from an insulating material that may be contiguous with the insulating material that surrounds the writing device 20B and the magnetic film 10.

The domain wall 635 is pushed to the middle of ferromagnetic block 615 by the current 640. The embodiment shown in FIG. 6 may be easier to fabricate than the embodiment shown in FIG. 5.

Figure 7:
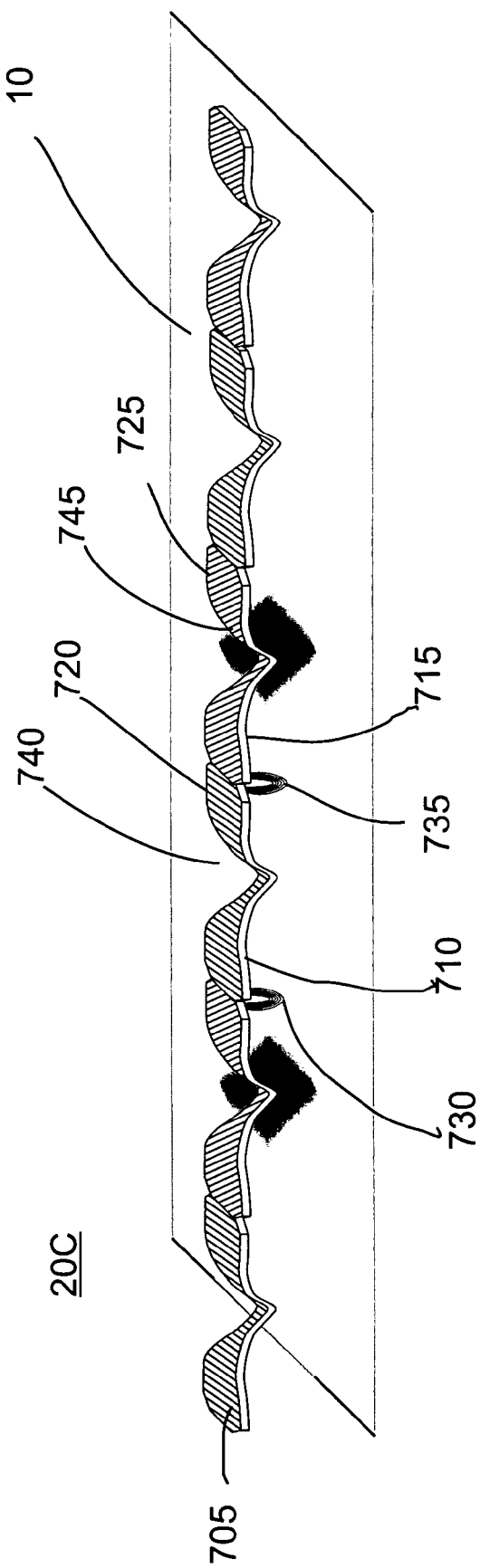
FIG. 7 represents a configuration of an alternative embodiment of the writing device of the magnetic memory device of FIG. 1, using multiple types of ferromagnetic or ferrimagnetic material.

In a further embodiment, the homogeneous ferromagnetic or ferrimagnetic material in the writing device 20C can be replaced by inhomogeneous ferromagnetic or ferromagnetic material, as shown in FIG. 7. Track 705 of the writing device 20C is constructed of alternating types of ferromagnetic or ferrimagnetic materials.

For example, blocks 710 and 720 are formed from one type of magnetic material while blocks 715 and 725 are formed of another type. These alternating types of ferromagnetic or ferrimagnetic materials serve to create defined regions in which the domains in the track 705 reside in their quiescent position. The magnetic moments of blocks 710 and 720 are aligned in the same direction, so that no fringing fields are applied to the magnetic film 10 when the writing device 20C is in the quiescent state.

Writing to the magnetic film 10 is carried out by moving the domain walls along the magnetic track 705 by passing a current along this track. When the domain walls 730, 735 are moved, by application of a current pulse (or a train of pulses) in the proper direction along the track 705, the corresponding domain wall 730 or 735 is brought to the writing region 740, where the track is in close proximity to the magnetic film 10. The track may be designed, for example, by having a different width in the proximity of the data region 740, so that the domain wall preferably resides in this position and requires a second current pulse to move the domain wall from the writing position to its quiescent position, away from the writing region.

Although only the upper track of the writing device 20C is shown in FIG. 7, a similar lower track may also be added. This lower track may be positioned at an angle to the upper track. The writing of the data region 740 is only carried out when this region is subjected to a combination of magnetic fields from domain walls moved to the writing region in both the upper and lower tracks.

It may be preferred that the domain wall in either the upper or lower tracks is first moved to the writing region 740, so that the region 740 is subjected to a first magnetic field. Subsequently, the second domain wall is moved to the opposite side of the writing region, or is moved across the writing region 740, without stopping. This method may be advantageous so that the timing of the movement of the domain walls in the corresponding upper and lower tracks is not so critical, as when both the domain walls in the upper and lower tracks are moved concurrently through the magnetic writing region, without either stopping in this region.

In one embodiment, the domain walls are moved so that they are situated over the data bits 740, 745 for a time determined by sequential current pulses. The first pulse moves the domain wall fringing fields 730 and 735 near the magnetic film 10. In a similar manner, a current pulse moves domain walls along a corresponding track below the magnetic film 10 so that the fringing field from the domain wall below the magnetic film 10 arrives concurrently with that from above the layer 10.

By adjusting the time of arrival of the domain walls and their associated fringing fields, the length of time for which the combined field from the domain walls is large enough to write the magnetic layer 10 can be adjusted. It may be advantageous to have different strengths of fringing fields from the two domain walls above and below the layer 10. The domain wall fringing field can be readily varied either by varying the physical separation of the tracks from the layer 10 or by varying the properties of the magnetic material from which the tracks are fabricated or by varying the shape and size (e.g., thickness and width) of the tracks.

In another embodiment, the magnetic regions or domains 710 and 720 can be combined and formed from one magnetic material. The magnetic regions 715 and 725 together are formed from an alternate magnetic material. This pattern may be repeated throughout the track 705. There is no need to have a means of providing a pinning potential for the domain wall directly above the magnetic film 10. The writing of the magnetic film 10 can be performed by simply passing the domain wall and its associated fringing field near the magnetic film 10 without stopping the domain wall above the bit to be written.

In general, the track used to provide the domain walls for writing the magnetic bits into the magnetic storage film 10 is designed so that the domain walls reside at well defined positions away from the writing positions in their quiescent state. The positions are defined either by shaping the wire, for example, by forming notches, where the track width is slightly reduced, or, alternatively, by protuberances, where the track width is increased slightly, or by forming the track from regions of different magnetic materials with different magnetic properties, for example, different magnetizations and/or magnetic anisotropies or by combinations of these methods.

The embodiment in FIG. 7 shows the use of both notches and alternating magnetic materials to define the positions of the domain walls in the quiescent state. The choice of which method is used may depend particularly on the method and ease of fabrication of the tracks.

In addition to fabricating the track so that the domain walls reside at particular places along the track on either side of the writing positions, the track can also be designed, by using the placement of magnetic materials or by shaping the track, so that the domain wall will also reside at the writing position. In the latter case, one current pulse is used to drive the domain wall from one of the quiescent state positions to the writing position and a second current pulse is used to drive the domain wall from the writing position to one of the quiescent state positions (this may be the same quiescent position from which the domain wall was first moved or this may be the quiescent position on the other side of the writing position).

Furthermore, the tracks above and below the magnetic storage film can be designed differently so that one track may have a fixed position for the domain wall during writing and the other track may not have such a position. Thus, for the purposes of writing a magnetic region into the magnetic film 10 a current pulse may first be used in one of the tracks to drive a domain wall to the writing position in this track.

Then, a current pulse in the corresponding track on the other side of the magnetic film may be used to drive a domain wall across the writing position from one quiescent state to the other. Thus, the magnetic bit is written by the combination of a static field provided by one domain wall fringing field and a dynamic, or moving domain wall fringing field provided by the domain wall in the opposing track. As a result, methods of precessional rotation of the magnetization of the magnetic bit 45 can be used by first applying, with the domain wall fringing fields from one track, a static magnetic field in one direction and then, using the domain wall fringing fields from the second track, a dynamic magnetic field in the perpendicular direction.

The detailed spatial variation of the domain wall fringing fields will depend on the structure of the magnetic domain wall which, in turn, will depend on the magnetic properties of the magnetic materials forming the track as well as the detailed shape and size of the track, i.e., thickness and width of the magnetic material. The spatial variation of the fringing fields can be determined by micromagnetic simulations of the magnetic structure of the track.

These simulations show that the magnetization variation within the domain wall can be complex and can vary significantly as, for example, the thickness and width of the track is varied. Thus, the spatial distribution of the domain wall fringing fields can be optimized by micromagnetic modeling.

In particular, depending on these details, the sign of the domain wall fringing fields may depend on whether the domain wall is moving or is stationary and may depend on the direction of motion of the domain wall. Thus, the detailed procedure for writing the magnetic regions into the magnetic storage film 10 will depend on the detailed magnetic structure of the domain wall and its associated fringing fields.

The detailed structure and composition of the tracks which comprise the writing device 20 will influence the distribution of magnetization in the domain walls and thus the domain wall fringing field distribution. Thus, the direction of the magnetization of the written bit 45 will depend on the detailed structure of the writing device 20. Therefore, the direction of the magnetization of the bit 45 can be designed to be largely along one of the tracks in the writing device 20, e.g., the along the direction of the upper tracks or the direction of the lower tracks, or can be designed to lie along a direction at some angle to the upper or lower track direction.

The magnetic material forming the tracks can be comprised of various magnetic materials such as Fe, Co, and Ni, and binary and ternary alloys formed from a combination of these ferromagnetic metals, or from alloys formed from one or more of these elements in combination with other elements chosen, for example, for the purposes of providing higher magnetic anisotropy. Since the magnitude of the fringing fields from the domain wall depends on the width of the domain wall and typically increases as the domain wall is narrowed, it may be advantageous to form the tracks from magnetic material with higher magnetic anisotropy than can be obtained from alloys of Fe, Co and Ni alone. For example, the magnetic anisotropy of Fe and Co and Ni can be increased by combining these elements with Pt or Pd.

The domain wall fringing fields will also be increased, when the magnetization of the magnetic material is higher, so it may be advantageous to form the track from alloys containing large amounts of Fe and Co, which have higher magnetization values than Ni. The choice of the material forming the track will also influence the magnitude of the current and the length of the current pulse required to move the domain walls along the tracks.

The higher the magnetic anisotropy, the larger the current pulse magnitude and length are likely to be. Similarly, the damping factor of the magnetic material is important in influencing the magnitude of the current pulse required to move the domain walls. The damping factor can be varied by doping the magnetic material with transition or rare-earth metals as, for example, described in U.S. Pat. No. 6,452,240.

An important advantage of using current pulses to change the direction of the magnetization of the track by moving domain walls thereby, is that current pulses of reasonable magnitude can be used to move domain walls and so change the magnetization direction of regions of the track even under circumstances where large external magnetic fields are needed to change the magnetization direction of the track. This is because the method of changing the local magnetization direction is very different whether using external magnetic fields or domain wall fringing fields.

The tracks may be lithographically fabricated so that the choice of the magnetic material forming the track will be influenced by the method chosen to fabricate the tracks. For example, it may be advantageous to form the track from a material which can be etched either by reactive ion etching or by wet chemical etching or by ion milling. Furthermore, it may also be advantageous to form the tracks from material which does not suffer corrosion during the fabrication of the tracks.

The track may be comprised of a single magnetic layer but it may be advantageous to form the track from a multiplicity of magnetic layers. For example, it may be useful for the purposes of moving the domain walls with smaller electrical currents to vary the electrical conductivity of the track so that the conductivity is higher at the top and bottom surfaces of the track.

This will allow for an inhomogeneous current distribution across the cross-section of the track so that the current may be higher at the top and bottom surfaces of the track. For example, the domain walls may experience some drag from the surfaces of the track, due, for example, to roughness of these surfaces, so that having higher current densities at the extremities of the track may allow for a lower overall current through the track to move the domain walls. Smaller currents are advantageous because they will lower the energy required to move the domain walls along the tracks.

Figure 8:
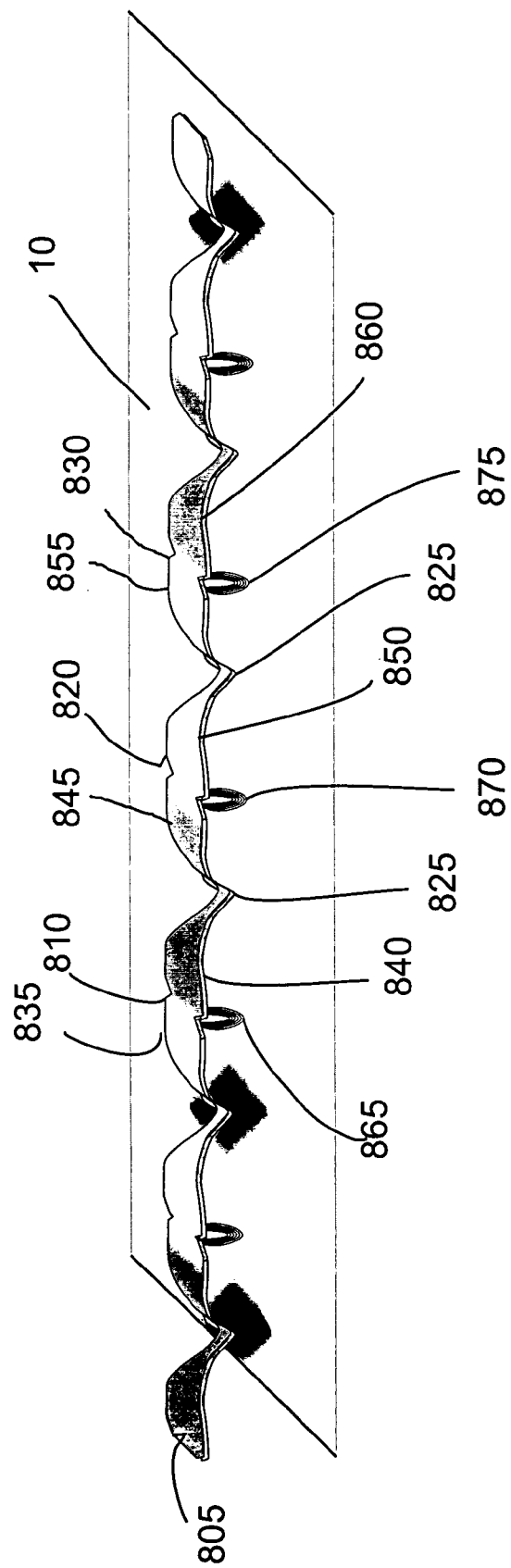
FIG. 8 represents a configuration of another alternative embodiment of the writing device of the magnetic memory device of FIG. 1, using indentations (or alternatively protuberances) in a track of ferromagnetic or ferrimagnetic material.

The pinning of domain walls at particular locations along the track may be effected, as shown in track 805 of the writing device 20D in FIG. 8 by introducing indentations (or protuberances) 810, 820, 830 along the track. The indentations (or protuberances) 810, 820, 830 are placed between domains 835 and 840, 845 and 850, 855 and 860, respectively.

These indentations (or protuberances) 810, 820, 830 serve to fix the regions in which the domains in the track 805 reside because the energy of the domain wall depends on the width of the track. The indentations (or protuberances) 810, 820, 830 can be of any physical form that provides a pinning potential for the domain walls.

As shown in FIG. 8, the indentations (or protuberances) 810, 820, 830 are on both sides of the writing element track 805. Alternatively, they can be on one side or disposed on the top or the bottom of the writing device's track 805. The indentations (or protuberances) can also be protuberances. The indentations (or protuberances) in FIG. 8 serve to fix the positions of the domain walls in their quiescent states when they are not writing.

Indentations (or protuberances) may also be placed along the track at the writing positions as illustrated in FIG. 8 by the indentations (or protuberances) 825. In the present illustration, indentations (or protuberances) 825 are placed in close proximity to the magnetic film 10, to fix the placement of fringing fields 865, 870, 875 that are used to write to the magnetic film 10. When an appropriate current is applied to track 805, the fringing fields 865 and 870 (for example) move to indentions 820, allowing precision placement of the fringing field. In a further embodiment, the writing device may be made of a combination of different ferromagnetic or ferrimagnetic materials with indentations or protuberances.

In another embodiment, no indentation is made along the tracks of the writing device 20 at the writing positions. The writing of the magnetic film 10 is achieved simply by moving the domain walls and their associated fringing fields close to the magnetic film 10 without ever having the domain walls stationary above and below the magnetic film 10.

The local magnetic fields of the fringing fields can be very large and can approach the magnetization of the material, 4 $\pi$M. In disk drive magnetic recording write heads, the maximum achievable field is about 4 $\pi$M of the magnetic disk material. Disk drive development seeks to make the magnetization larger, making larger magnetic moments and larger fields to ensure adequate writing to the disk.

In the present writing device, the magnitude of the domain wall fringing fields is related to the magnitude of the material used in the writing device 20. Local fields of several thousand oersteds are achievable. Consequently, the writing device can write strongly and reliably to the magnetic film 10. The width of the writing device is the width of the data bit written on the magnetic film 10. In one embodiment, the typical width of the writing device is about 100 nm in size.

The current required to move the domain walls along the tracks will decrease as the area of the magnetic material forming the track is decreased. Thus, the method of writing magnetic regions using domain wall fringing fields from domain walls is advantageous for writing very small magnetic regions, and, advantageously, scales with scaling of the track widths to smaller dimensions for higher capacity memory devices.

The width of the magnetic region will be determined by the spatial variation of the domain wall fringing field. The extent of the written magnetic region will be determined by the boundary where the domain wall fringing field exceeds the magnetic switching field of the magnetic material comprising the magnetic film 10. Thus, this width will be related to the physical width of the tracks forming the writing device 20 but will not be exactly the same as this width.

A device similar to a magnetic tunneling junction can be used to read the information stored on the magnetic storage film 10. A magnetic tunneling junction (MTJ) has two layers of magnetic material separated by a thin layer of insulating material that comprises a tunneling barrier. This tunneling barrier is typically formed from an ultra thin layer of aluminum oxide although it can also be formed from other insulating or semiconducting materials such as MgO.

One magnetic layer in the MTJ is typically a hard magnetic material that requires a large magnetic field to change its magnetization. The other magnetic material is typically a soft magnetic material, allowing a weak magnetic field to change its magnetization. When a small magnetic field is applied to the soft magnetic material, its direction of magnetization changes so that the direction of the magnetization of the soft magnetic layer can be varied relative to that of the hard magnetic material.

When a fixed voltage is applied across the MTJ, the magnitude of the current passed through the tunneling barrier depends on the relative magnetic orientation of the two magnetic materials in the tunneling junction. Consequently, the value of the current in the tunneling junction indicates the direction of the magnetic moment in the soft magnetic material if the moment of the hard layer is known. Conversely, the current in the tunneling junction indicates the direction of the moment of the hard magnetic material if the direction of the moment of the soft magnetic material is known.

The two magnetic materials in the magnetic tunneling junction can also be formed from hard magnetic materials if means for independently switching the magnetic moments in the MTJ are provided, as in the magnetic memory device 100. The tunneling current passing through the MTJ allows the direction of the magnetic moment of either one of the two magnetic materials in the MTJ, i.e., the storage layer, to be determined if the direction of the magnetic moment of the other material, i.e., the reference layer, is known.

There is a sequence of domain walls within the tracks of the writing device 20. In one region, the moments are in one direction. In another region, the moments are in another direction. The sequence of domain walls within the track is known to the controller of the magnetic memory device 100. The controller keeps track of the location of the domain walls in the track. Consequently, the moment of the data bit 45 can be determined by passing a current from the upper track through the data bit 45 and the lower track.

A large value of current indicates that the resistance of the MTJ is low, and the domains of the track and the data bit 45 are in parallel. A small value of current indicates that the resistance of the MTJ is high, and the domains of the track and the data bit 45 are anti-parallel. Since the direction of the domain in the track is known, the direction of the domain and thus the data stored in the data bit 45 can be inferred.

Figure 9:
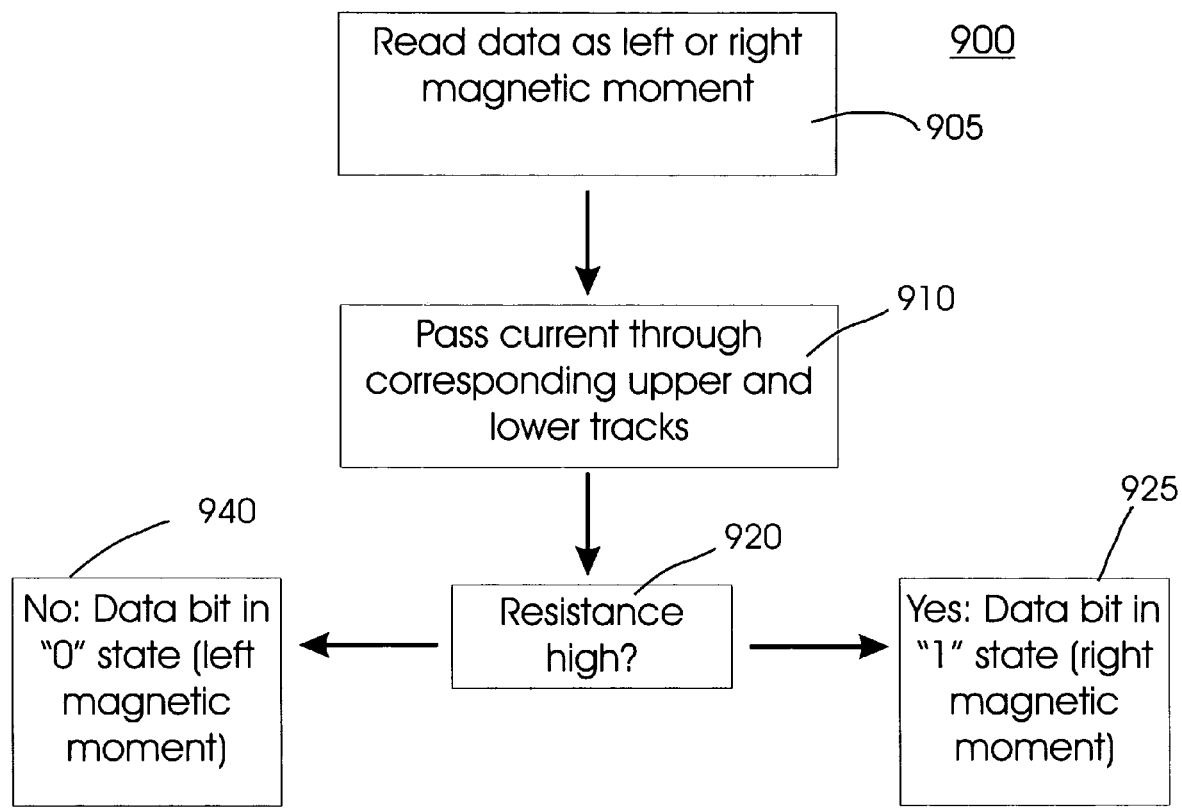
FIG. 9 is a process flow chart illustrating a method of operation of reading data from the magnetic memory device of FIG. 1.

A method 900 for reading a data bit 45 in the magnetic film 10 by the use of a magnetic tunnel junction is described by the process flow chart of FIG. 9 in conjunction with FIG. 10 (FIGS. 10A and 10B). As shown in FIG. 10 the magnetic tunnel junction used for the purposes of reading the data in the magnetic storage film 10 is formed from one or both of the upper and lower tracks 25 and 35, respectively, in addition to the storage film itself.

The tracks 25 and 35 are separated from the storage film at the writing points where the track comes close to the storage layer by thin insulating layers 1080 and 1090 which form the insulating barrier of the magnetic tunnel junction. For ease of fabrication, it is preferable that one tunnel barrier be thicker than the other tunnel barrier. Since the resistance of a tunnel barrier increases exponentially with the thickness of the insulating tunnel barrier, it may be difficult to form two tunnel barriers with approximately equal resistance values.

In practice, however, the tunnel barrier resistance is extremely sensitive to the morphology of the tunnel barrier layer so that even when tunnel barriers have nominally the same thickness, their resistance can vary significantly. Since the morphology of the tunnel barrier depends critically on the structure and morphology and chemical composition of the underlayer on which it is grown, the morphology and the consequent resistance of the tunnel barrier 1090, which is grown on top of the track 35, may be different from that of the tunnel barrier 1080, which is deposited on top of the magnetic storage film 10.

For the purpose of illustration, the tunnel barrier 1080 is shown as being thicker than the tunnel barrier 1090 in FIG. 10, so that the resistance of the tunnel junction formed between the lower magnetic track 35 and the upper magnetic track 25 will be dominated by the thicker tunnel barrier 1080. Thus, the ferromagnetic electrodes of the magnetic tunnel junction are formed from the magnetic material of the upper track 25 and the magnetic material in the magnetic storage film 10 since the resistance of the tunnel junction is determined by that of the upper insulating layer 1080. Therefore, in this example, the resistance of the lower insulating layer 1090 is sufficiently small that it does not significantly contribute to the resistance of the tunnel junction.

The magnetic direction of the data bit 45, which is represented by the left directed arrow 1055 in FIG. 10A and the right directed arrow 1065 in FIG. 10B, is read as a left or right directed magnetic moment, as shown by the block 905 in FIG. 9, by passing a small current through the corresponding upper and lower tracks 25 and 35 at whose cross point the data bit 45 resides. The direction of the current path is shown by the line 1052 in FIG. 10A and the line 1062 in FIG. 10B.

The current is passed along the upper track 25 through the upper insulating layer 1080, through the data bit 45, through the lower insulating layer 1090, and along the lower track 35 as shown in the block 910 in FIG. 9. In FIG. 10 A the direction of the moment of the data bit 45 is shown as being directed in the same direction as the magnetic domain in the upper track.

Thus, the resistance of the magnetic tunnel junction will be low and the current 1050 will be large, as illustrated by blocks 920, 940 in FIG. 9. By contrast, in FIG. 10B, the magnetization of the data bit 45 is directed along the rightmost direction and is anti-parallel to that of the magnetic domain in the upper track so the resistance of the magnetic tunnel junction will be high and the current 1060 will be small. Thus, as illustrated by blocks 920, 925 in FIG. 9, the data bit is determined to be a "1".

The current used for reading the state of the data bits is much smaller than the current used to move domains along the tracks so the reading current will not affect the state of the data bits. The actual current used for reading will depend on the resistance of the tunnel junction which is designed to be sufficiently high that the resistance of the upper and lower tracks is negligible compared to the resistance of the tunnel junction.

Similarly, the higher the resistance of the tunnel junction, the smaller will be the current leaking into the array of tunnel junctions formed from the array of upper and lower writing tracks. In this embodiment all of the tunnel junctions associated with each data bit are connected in parallel with each other. The reading current is passed through the data bit for no longer than is necessary to get enough signal to determine whether the tunnel junction has a high or low resistance in order to minimize the energy needed to read one bit. For this purpose, there may be reference resistors formed from similar tunnel junctions at the array boundary with which the resistance of the data bit tunnel junctions can be compared.

Thus, in the memory system 100 described herein, the MTJ is formed from two hard magnetic layers. The direction of the magnetic domain in the upper track in the writing device 20 can only be altered by passing current pulses along this track. The magnetic moment direction of the data bit 45 can similarly only be varied by being subject to the large magnetic fringing fields provided by moving domains in the upper and lower tracks. In essence, the magnetic domain in the upper or lower tracks provides the reference magnetic moment and the data bit provides the storage magnetic moment.

If necessary, for larger read signals, the resistance of the MTJ formed from the magnetic domain 1025 in the upper track 25 and the magnetic data storage bit 45 can first be read by passing the current 1050 through this MTJ. Then, a current can be passed along the upper track to move the fringing fields 1020, 1030 of the domain walls in this track by one position to magnetic domain 1035. Thus, the direction of the magnetic moment in the track will be changed from being left, as shown in FIG. 10A, to being right.

The resistance of the MTJ is read a second time by passing a small reading current through the MTJ. However, the resistance will now be high because the direction of the domain in the upper track 25 will now be in the opposite direction to that of the data bit 45. Passing a current along the upper track along, without concurrently passing a current along the lower track 35, will only move the domains in the upper track without changing the magnetic state of the data bit 45.

Thus, this method of reading the data bit will give much higher signal because this method only requires the difference in resistance of the MTJ to be read. The state of the data bit is determined by whether the resistance of the MTJ is increased or decreased when the direction of the magnetization within the magnetic domain in the upper track is reversed.

The material forming the magnetic film 10 is comprised of one or more magnetic layers. The properties of the magnetic film are chosen so that the magnetic film can, support very small magnetic regions. Moreover, these small magnetic regions, whose size is largely determined by the spatial extent of the domain wall fringing fields, must be of a sufficient size that the magnetic anisotropy of this region is great enough to withstand thermal fluctuations, i.e., the superparamagnetic effect.

When the region is too small, thermal fluctuations contain sufficient energy at the operating temperature of the device that the magnetic moment of the magnetic regions can overcome the energy barrier provided by the magnetocrystalline anisotropy of the magnetic material within one magnetic region. Thus, the types of materials and structures used for high density magnetic thin film media in magnetic recording disk drives are suitable.

An important difference, however, is that in the memory of the present invention, the materials forming the magnetic storage film 10 are not limited to polycrystalline materials. Crystalline materials may be used to form the magnetic film 10 wherein the crystalline materials have an anisotropy direction aligned along one direction within the magnetic film. For example, the magnetic easy axis may be aligned along the direction of one set of tracks (for example, those above the magnetic film 10).

In magnetic recording disk drives the magnetic bits are written around the circumference of the rotating disk. Thus, the magnetic crystalline anisotropy must be aligned either randomly within the plane of the magnetic media or the anisotropy direction must be aligned either along the disk radius or must be tangential to the disk radius. This precludes the use of crystalline magnetic films with a well defined crystalline axis along one given direction.

It should be understood that the present invention is not limited to magnetic materials whose moments are in the plane of the magnetic film 10, but the moments of the magnetic films 10 may be oriented perpendicular to the plane of the film 10 since the domain wall fringing fields from the domain walls in the tracks of the writing device 20 can have a significant component of magnetic field in a direction normal to the surface of the magnetic wires comprising the tracks. Thus, the material comprising the layer 10 may be designed to have perpendicular magnetic anisotropy, and can be crystalline or polycrystalline.

Alternate embodiments of the construction of the magnetic film 10 are illustrated by FIG. 11 (FIGS. 11A, 11B, 11C). Magnetic film 10A is constructed using a film of one magnetic alloy.

Magnetic film 10B is a granular magnetic alloy comprised of magnetic regions in an insulating film. This structure may be useful to decrease the current that flows along the magnetic storage film 10 when reading the data storage regions. The resistance in the plane of the film will be much larger than the resistance perpendicular through the film since the film is very thin. A metallic granular film could also be used. For example, this may be advantageous to form a magnetic material with higher magnetic anisotropy, since the surface of magnetic grains often has enhanced magnetic anisotropy.

For improving the read performance, it may be particularly advantageous to form the magnetic film 10 from a material that has a much lower resistance perpendicular to the layer than in the plane of the layer. For example, it may be preferred to form the magnetic film 10B from a granular material comprised of magnetic columnar grains that extend from the lower to the upper surfaces of the film 10B but that are electrically isolated from one another in the direction parallel to the plane of the film 10B.

For example, these columnar magnetic grains may be isolated from each other in the lateral direction by an insulating oxide, such as aluminum oxide or silicon oxide or magnesium oxide, or by an insulating nitride, such as aluminum nitride. Thus, the insulating material is along the grain boundaries of the cylindrically shaped grains where the axis of the cylinder of these grains is oriented perpendicular to the surface of the magnetic film 10B.

Magnetic film 10C is an artificial antiferromagnetic structure engineered for improved stability against thermal fluctuations. For example, the film structure may be comprised of two ferromagnetic layers 1115 and 1120 separated by an antiferromagnetic coupling layer 1110. The antiferromagnetic coupling layer 1110 can be formed from Ru or Ru—Os alloys as described in U.S. Pat. Nos. 5,465,185 and 6,153,320 or with Cr and various other non-ferromagnetic metals as described in U.S. Pat. No. 5,341,118.

In all the embodiments shown in FIG. 11, the magnetic layers may be formed from multiple magnetic and non-magnetic layers. For the maximum signal for reading the data bits it may be advantageous to form the upper and lower surfaces of the magnetic film from magnetic material which, in conjunction with a suitable insulating barrier layer, gives rise to highly spin polarized tunneling current. As an example, MgO barriers may be used in conjunction with Co—Fe alloys. Thus, the signal for reading the direction of the magnetic data bits will be maximized.

Figure 12:
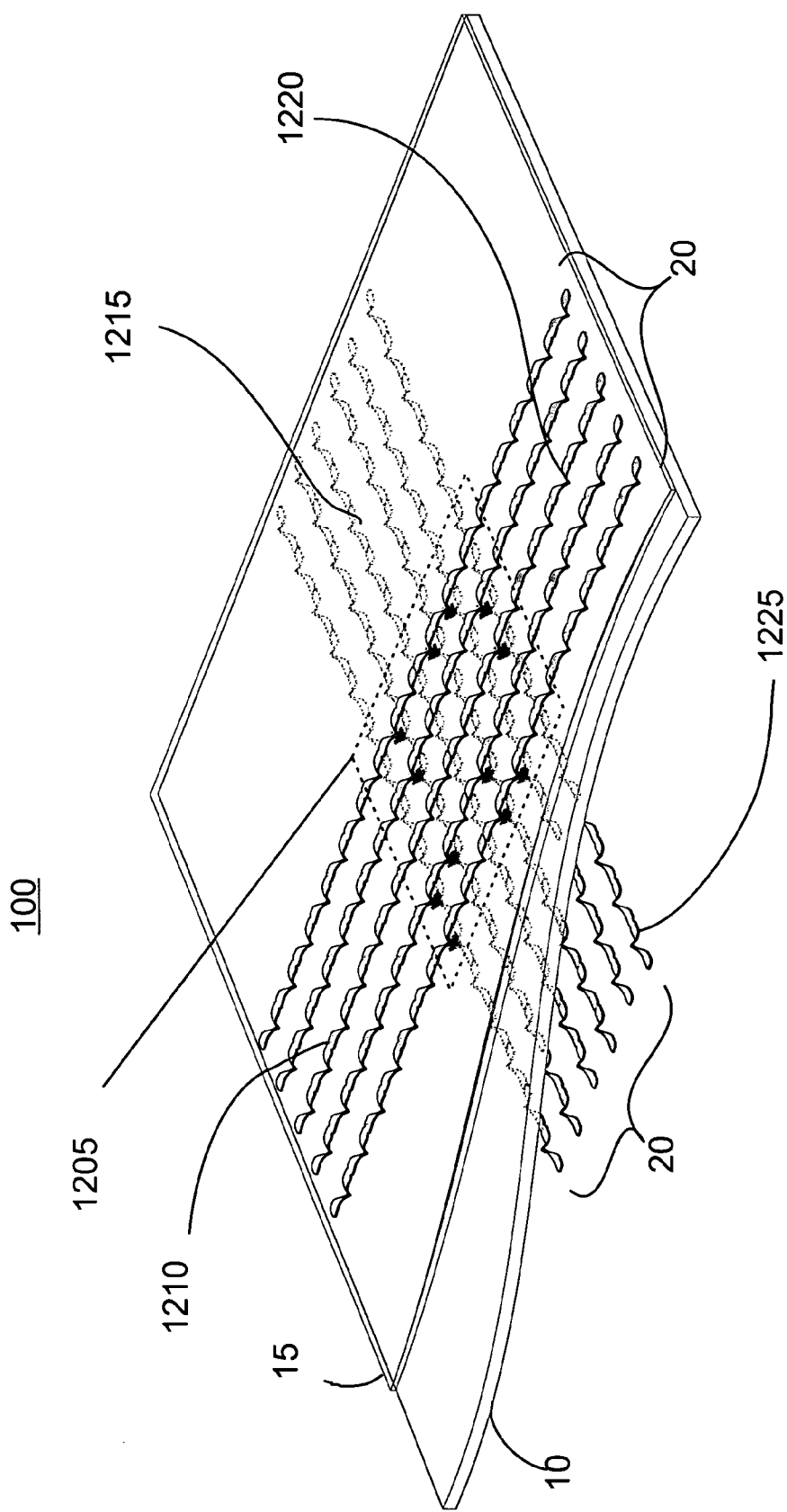
FIG. 12 is a diagram illustrating the use of a reservoir for domains in the writing and reading tracks of the magnetic memory device of FIG. 1.

As shown in FIG. 12, a reservoir for storing bits in the tracks of the writing device 20 is desired for optimal performance. The reservoir may be of varying sizes, from one domain to enough length to accommodate all the domains in the data storage region on both sides of the data storage region.

In FIG. 12, a reservoir is shown on each side of the data storage region 1205: reservoirs 1210, 1215, 1220, and 1225. Each reservoir is long enough to accommodate all the domains in the tracks that write to and read from the data storage region 1205. The domains in the tracks that write to and read from the data storage region 1205 can be moved in and out of their respective reservoirs 1210, 1215, 1220, 1225 depending on the sequence of "1"s and "0"s to be written.

Figures 13A, 13B:
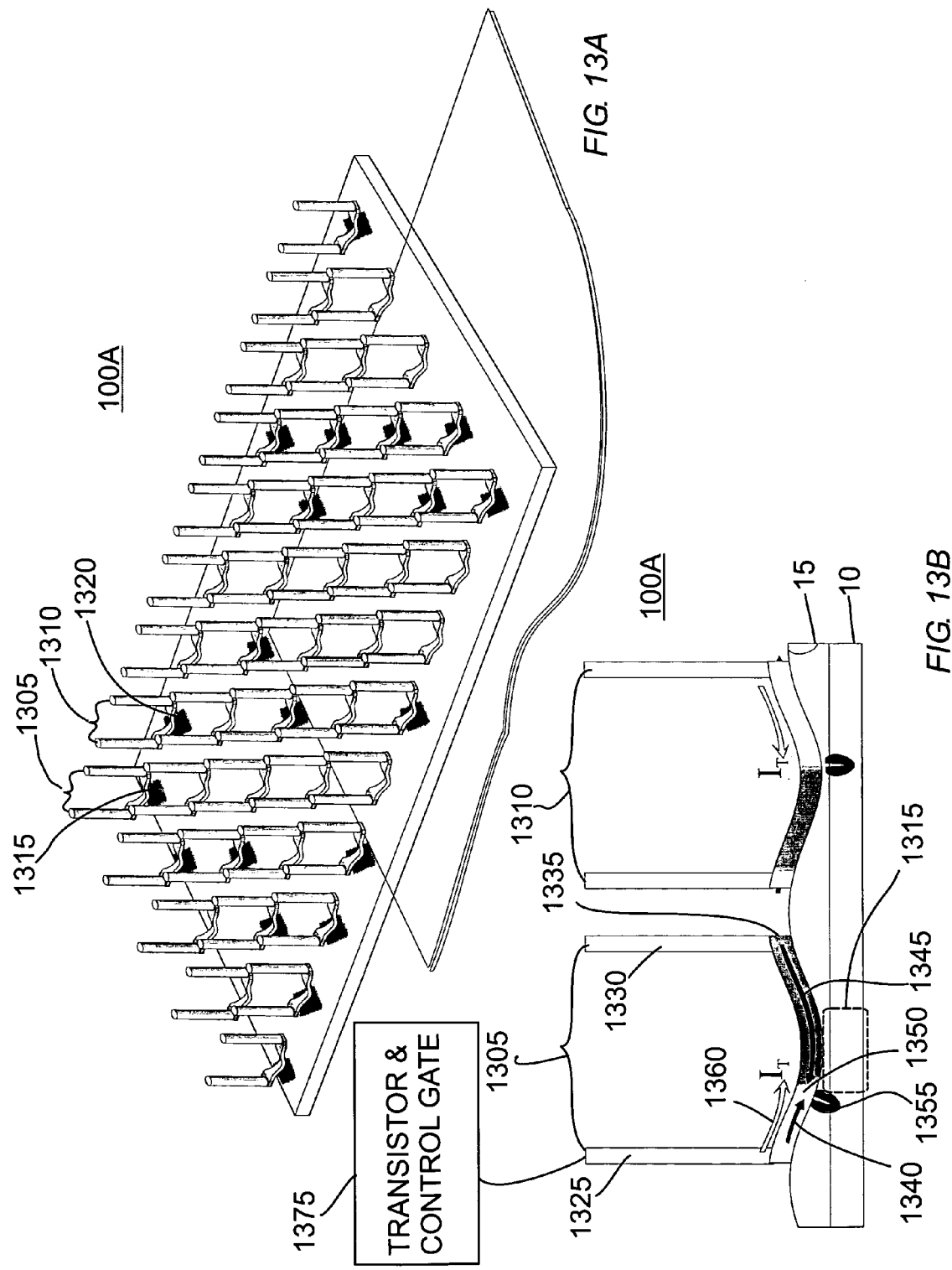
FIG. 13 is comprised of FIGS. 13A and 13B, and illustrates an alternative embodiment of the magnetic memory device of FIG. 1 using individually controlled registers to write to the magnetic film.

In an alternative embodiment for the magnetic memory device 100, a magnetic memory device 100A is shown in FIG. 13 comprised of individual registers 1305, 1310 that write individual data bits 1315, 1320. Each register represented by register 1305 is comprised of current leads 1325, 1330 and a magnetic wire or track 1335.

The track 1335 is comprised of two domains 1340, 1345 and one domain wall 1350. The fringing field 1355 emanating from domain wall 1345 is sufficiently large to write to data bit 1315. The current leads 1325, 1330 are made of magnetic material and are of sufficient length to act as reservoirs for the domains 1340, 1345. Current 1360 is applied to the register 1305, moving fringing field 1355 into the region of the data bit 1315.

As discussed previously, the fringing field 1355 writes to the data bit 1315. The current 1360 then moves the fringing field 1355 out of the region of the data bit 1315 once the data bit 1315 has been written. Each of the registers 1305, 1310 is controlled individually by a transistor and control gate denoted by the reference 1375, that pass current through the register 1305, 1310 to write data to the magnetic film 10.

The current leads 1325, 1330 and the individual write registers 1305, 1310 are shown in FIG. 13 above the magnetic storage layer 10. In order to connect these leads to individual transistors 1375 the transistors are preferably formed in a silicon substrate beneath the magnetic film 10. Thus, if the current leads are above the magnetic layer 10, vias are provided through the magnetic film to allow connections between these current leads and the transistor switches in the silicon substrate.

As described with respect to the embodiment shown in FIG. 1 the magnetic film 10 does not have to be continuous but can be formed from multiple magnetic sections (each larger than an individual magnetic data bit). Thus, vias can be formed between these magnetic sections through the plane defined by the magnetic film 10. The magnetic film 10 are discontinuous and are comprised of multiple magnetic sections separated from conducting vias placed between these sections. The conducting vias are electrically isolated from the magnetic sections by insulating material.

The current leads 1325, 1330 and the individual write registers 1305, 1310 can also be disposed beneath the magnetic film 10 which makes it more straightforward to connect these leads to switching transistors in a semiconducting substrate beneath the layer.

Although the individual write registers are shown in FIG. 13 without any notches or means of fixing the position of the domain walls in these write registers, the registers can be formed with one or more notches or protuberances or can be formed from multiple connected magnetic regions comprised of different magnetic materials for the purpose of fixing domain walls at the boundaries between these magnetic materials for within these magnetic regions. Depending on the properties of these different magnetic materials, the domain walls will have a preference to be located either at the boundaries between these materials or away from these boundaries with the magnetic regions themselves.

In a preferred embodiment the individual write registers are comprised of three magnetic domains with two magnetic domain walls which gives rise to magnetic domain fringing fields of opposite sign. Thus, by moving one or the other of these domain walls over the magnetic region to be written, the magnetic data bit can be written in one direction or the opposite direction. The write register is preferably long enough to contain a storage reservoir for these domain walls to the left and right of the magnetic data region or in the vertical portions of the current leads themselves to allow for greater data storage densities.

In the alternative embodiment shown in FIG. 13 in which the write registers only contain one domain wall, the domain wall fringing field can be along one direction on one side of the domain wall and along the opposite direction on the other side of the domain wall, as illustrated in FIG. 3B for the x component of the fringing field associated with the Neel type of domain wall shown in FIG. 3A. Thus, when the domain wall shown in FIG. 3A is moved over the magnetic film 10, the magnetic data bit 45 is written in one direction when the domain wall is moved from the left to the right along the x axis. As shown in FIG. 3B, the magnetic film is written in the negative x direction, i.e., its magnetization is pointing to the left.

However, if the same domain wall is moved from the right to the left, the magnetic data bit in the film 10 is written with its magnetization direction pointing in the positive x direction (i.e., magnetization points to the right). Thus, a single domain wall can be used to write data bits to both the left and to the right. The direction of motion of the domain wall (left to right or right to left) determines the direction of writing. Thus, depending on the position of the domain wall in the write register, it may be necessary to first move the domain wall to the left or to the right in order to write a magnetic data bit in the left direction or the right direction.

In the device shown in FIG. 13 the magnetic data bits are read by passing small currents through one of the leads 1325,1330 and through a tunnel barrier, formed as a thin insulating layer 15 on top of the magnetic film 10, and into the magnetic data bit within the magnetic film 10 itself. The current path can be closed either through electrical contacts on the edges of the magnetic film 10 or on the opposite side of the magnetic film 10.

Figures 14A, 14B:
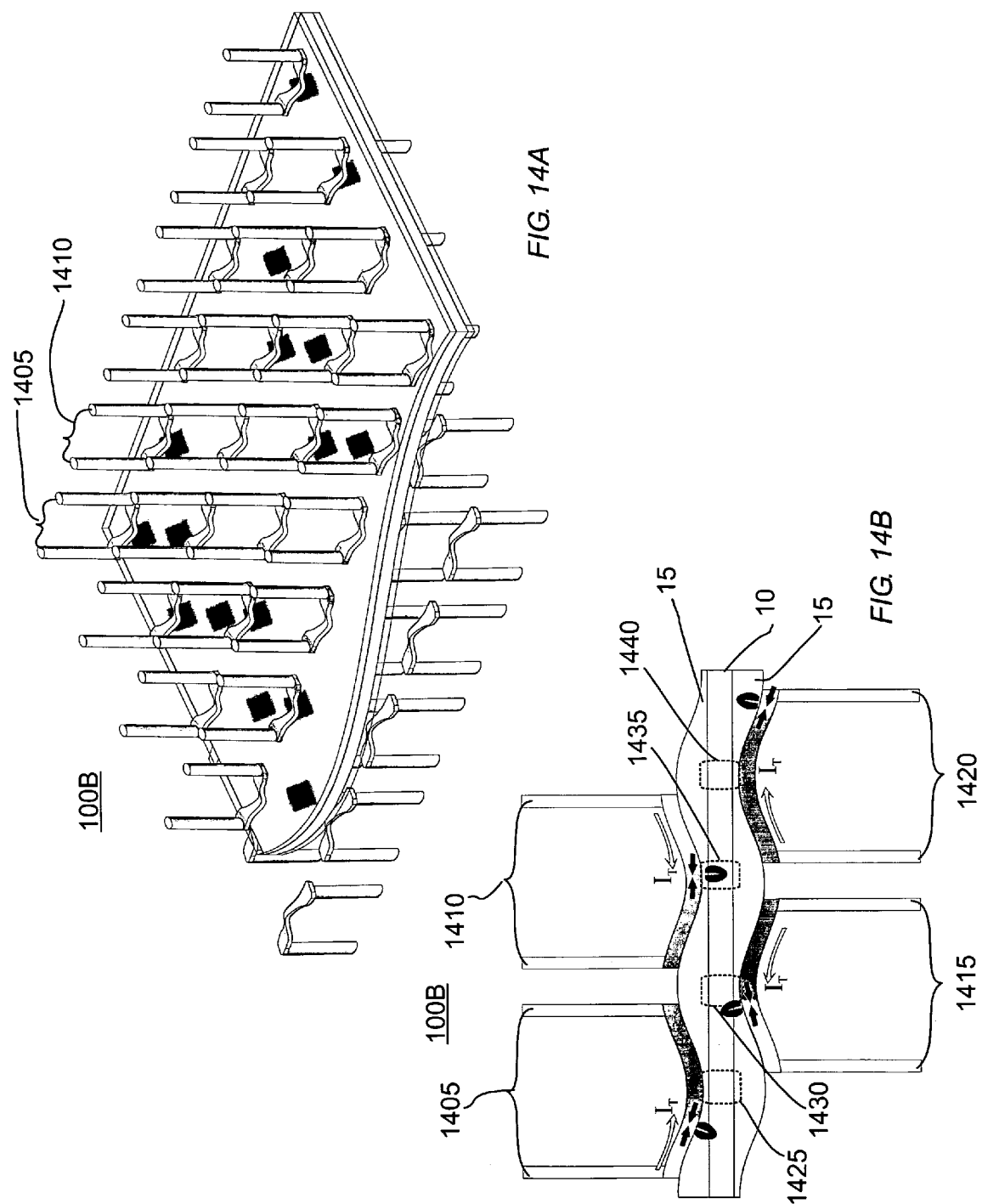
FIG. 14 is comprised of FIGS. 14A and 14B, and illustrates an embodiment of the magnetic memory device of FIG. 13.

In an embodiment of the magnetic memory device 100A shown in FIG. 14 (FIGS. 14A, 14B), magnetic memory device 100B has individual writing registers (represented by registers 1405,1410) situated on top of the magnetic film 10 in addition to writing registers (represented by registers 1415, 1420) on the bottom of the magnetic film 10. Data bits such as data bits 1425, 1430, 1435, 1440 are staggered to increase the data bit density and to avoid interference from neighboring fringing fields. In this embodiment, the aerial density of data bits is increased by a factor of two over the density of magnetic memory device 100A.

In an embodiment of the magnetic memory device 100B, magnetic memory device 100C has write registers 1505, 1510 perpendicular to write registers 1515, 1520. The relative placement of the registers 1505, 1510, 1515, and 1520 can be in any configuration as desired to achieve the desired aerial density and still retain the ability to apply current to the registers.

To operate the magnetic memory device 100, the circuitry comprises, in addition to the reading and writing elements, logic and other circuitry for a variety of purposes, including the operation of the reading and writing devices, the provision of current pulses to move the domains within the write registers, the means of coding and decoding data in data bits, etc. In one embodiment, the control circuit is fabricated using CMOS processes on a silicon wafer. The circuitry related to the individual magnetic data bits will be designed to have a small footprint on the silicon wafer so as to maximize the storage capacity of the memory device while utilizing the smallest area of silicon to keep the lowest possible cost.

It is to be understood that the specific embodiments of the invention that have been described are merely illustrative of certain application of the principle of the present invention. Numerous modifications may be made to the system and method for storing data in an unpatterned, continuous magnetic layer invention described herein without departing from the spirit and scope of the present invention.

What is claimed is:

1. A data storage device comprising:
    a continuous, unpatterned magnetic film comprising data regions for storing data;
    at least one writing element comprising a track for disposal in proximity to the magnetic film, wherein the track defines a magnetic domain wall that is caused to shift along the track in a direction of an electric current, when the electric current is passed through the track; and
    wherein a data bit is selectively writable into the data regions of the magnetic film, using a fringing field from the magnetic domain wall in the track to selectively change a direction of a magnetic moment in the data region.

2. The data storage device of claim 1, wherein the track comprises an upper track disposed above the magnetic film and a lower track disposed below the magnetic film.

3. The data storage device of claim 2, wherein a data bit is selectively writable into a data region of the magnetic film where the upper track and the lower track cross, using fringing fields from magnetic domain walls in the upper track and the lower track.

4. The data storage device of claim 3, wherein the fringing fields from the magnetic domain walls in the upper and lower tracks are coincidentally moved toward the magnetic film to change a direction of a magnetic moment in the data region, effectively writing the data bit to the magnetic film.

5. The data storage device of claim 4, wherein the magnetic domain walls are moved by passing a writing current in at least one of the upper track and the lower track.

6. The data storage device of claim 5, wherein the data is binary and comprises a first state and a second state;
    wherein the data bit assumes the first state in response to the current being passed in a first direction; and
    wherein the data bit assumes the second state in response to the writing current being passed in a second direction.

7. The data storage device of claim 3, wherein the magnetic domain walls of the upper and lower tracks define a plurality of domains; and wherein in a quiescent state, the domains are parked away from a data storage region of the magnetic film so that the fringing fields do not influence a state of the data region.

8. The data storage device of claim 3, wherein the plurality of upper tracks are connected together in series so that domain walls associated with magnetic regions defined by the magnetic domain walls are moved together across the data storage region.

9. The data storage device of claim 3, wherein the magnetic domain walls in at least one of the upper track and the lower track are pinned.

10. The data storage device of claim 9, wherein the magnetic domain walls in at least one of the upper track and the lower track are pinned by indentations in the at least one of the upper track and the lower track.

11. The data storage device of claim 2, wherein the track comprises an upper track and a plurality of lower tracks.

12. The data storage device of claim 11, wherein each of the upper track and the plurality of lower tracks comprises an individual magnetic wire.

13. The data storage device of claim 12, wherein the upper track and the plurality of lower tracks define a plurality of selectable data regions within the magnetic film.

14. The data storage device of claim 2, wherein the at least one writing element comprises a plurality of upper tracks and a lower track.

15. The data storage device of claim 14, wherein each of the plurality of upper tracks and the lower track comprises an individual magnetic wire.

16. The data storage device of claim 15, wherein the plurality of upper tracks and the lower track define a plurality of selectable data regions within the magnetic film.

17. The data storage device of claim 2, wherein the track comprises a plurality of upper tracks and a plurality of lower tracks.

18. The data storage device of claim 17, wherein each of the plurality of upper tracks and the plurality of lower tracks comprises an individual magnetic wire.

19. The data storage device of claim 18, wherein the plurality of upper tracks and the plurality of lower tracks define a plurality of selectable data regions on the magnetic film.

20. The data storage device of claim 2, wherein the upper track comprises a bend;
wherein the lower track comprises a bend; and
wherein the data region corresponds to a region of the magnetic film where the bend of the upper track and the bend of the lower track cross.

21. The data storage device of claim 2, wherein the magnetic film comprises a single magnetic layer.

22. The data storage device of claim 2, wherein the magnetic film comprises a plurality of superimposed magnetic layers.

23. The data storage device of claim 22, wherein at least some of the plurality of superimposed magnetic layers are separated by at least one non-ferromagnetic layer.

24. The data storage device of claim 2, wherein the upper track comprises a block of magnetic material selected from the group consisting of ferromagnetic material and ferrimagnetic material;
wherein the lower track comprises a block of magnetic material selected from the group consisting of ferromagnetic material and ferrimagnetic material; and
wherein the data region corresponds to a region of the magnetic film where the block of the upper track and the block of the lower track cross.

25. The data storage device of claim 2, wherein the track comprises homogeneous magnetic material selected from the group consisting of ferromagnetic material and ferrimagnetic material.

26. The data storage device of claim 2, wherein the track comprises inhomogeneous magnetic material selected from the group consisting of ferromagnetic material and ferrimagnetic material.

27. The data storage device of claim 2, wherein at least one of the upper track or the lower track is constructed of alternating types of magnetic materials selected from the group consisting of ferromagnetic material and ferrimagnetic material.

28. The data storage device of claim 2, wherein the magnetic film comprises an upper surface and a lower surface; and
further comprising an insulating, tunnel barrier layer that overlies at least one of the upper and lower surfaces of the magnetic film.

29. The data storage device of claim 2, wherein the data bit that is written in the data region is read by passing a reading current from the upper track to the lower track that coincides with the data region.

30. The data storage device of claim 29, wherein the data bit is read by measuring a magnetic direction of the data bit.

31. The data storage device of claim 30, wherein a first magnetic direction of the data bit is indicative of a first resistance value of the tunnel junction.

32. The data storage device of claim 30, wherein a second magnetic direction of the data bit is indicative of a second resistance value of the tunnel junction.

33. The data storage device of claim 30, wherein the first resistance value of the tunnel junction is lower than the second resistance value of the tunnel junction.

34. The data storage device of claim 2, wherein the data bit that is written in the data region is read by passing a reading current in only one of any of the upper track or the lower track that crosses with the data region.

35. The data storage device of claim 34, wherein the data bit is read by measuring a change in resistance of the magnetic tunnel junction surrounding the insulating tunnel barrier layer.

36. The data storage device of claim 2, wherein the upper and lower tracks are disposed at an angle relative to each other.

37. The data storage device of claim 2, wherein the upper and lower tracks are disposed at a right angle relative to each other.

38. The data storage device of claim 1, wherein the magnetic film is unstructured so as to render the location of the data bit non-localized.

39. The data storage device of claim 1, wherein the magnetic film is patterned.

40. The data storage device of claim 39, wherein the patterned magnetic film comprises a plurality of patterned magnetic sections.

41. The data storage device of claim 40, further comprising an insulating layer that overlies at least one side of the patterned magnetic film.

42. The data storage device of claim 41, wherein the insulating layer is patterned into a plurality of patterned insulation sections.

43. The data storage device of claim 42, wherein the plurality of patterned magnetic sections cross with the plurality of patterned insulation sections.

44. The data storage device of claim 40, wherein each of the plurality of patterned magnetic sections stores at least one data bit.

45. The data storage device of claim 40, wherein the plurality of patterned magnetic sections are similarly shaped.

46. The data storage device of claim 40, wherein at least some of the plurality of patterned magnetic sections are non-similarly shaped.

47. The data storage device of claim 40, wherein at least some of the plurality of patterned magnetic sections are circularly shaped.

48. The data storage device of claim 40, wherein at least some of the plurality of patterned magnetic sections are rectangularly shaped.

49. The data storage device of claim 40, wherein at least some of the plurality of patterned magnetic sections are square shaped.

50. The data storage device of claim 40, wherein at least some of the plurality of patterned magnetic sections are elliptically shaped.

51. The data storage device of claim 40, wherein at least some of the plurality of patterned magnetic sections are triangularly shaped.

52. The data storage device of claim 40, wherein at least some of the plurality of patterned magnetic sections are patterned into a plurality of rows.

53. The data storage device of claim 40, wherein at least some of the plurality of patterned magnetic sections are patterned into a plurality of columns.

54. The data storage device of claim 40, wherein at least some of the plurality of patterned magnetic sections are patterned into a plurality of rows and a plurality of columns.

55. The data storage device of claim 1, further comprising a switch connected to the track, to pass current through the track for the purpose of writing the data bit.

56. The data storage device of claim 55, wherein the switch comprises a transistor.

57. The data storage device of claim 1, further comprising an insulating tunnel barrier layer disposed in proximity to the magnetic film.

58. The data storage device of claim 57, wherein the insulating tunnel barrier layer and the magnetic film form a tunnel junction.

59. The data storage device of claim 1, wherein the track comprises a bend.

60. The data storage device of claim 1, wherein the magnetic film is unstructured so as to render the location of the data bit non-localized.

61. The data storage device of claim 1, wherein the magnetic film comprises a single magnetic layer.

62. The data storage device of claim 1, wherein the magnetic film comprises a plurality of superimposed magnetic layers.

63. The data storage device of claim 62, wherein at least some of the plurality of superimposed magnetic layers are separated by at least one non-ferromagnetic layer.

64. The data storage device of claim 1, wherein the at least one writing element comprises homogeneous magnetic material selected from the group consisting of ferromagnetic material and ferrimagnetic material.

65. The data storage device of claim 1, wherein the at least one writing element comprises inhomogeneous magnetic material selected from the group consisting of ferromagnetic material and ferrimagnetic material.

66. A method of making a data storage device, comprising:

forming a continuous, unpatterned magnetic film that comprises data regions for storing data;

forming at least one writing element by disposing a track in proximity to the magnetic film, wherein the track defines a magnetic domain wall that is caused to shift along the track in a direction of an electric current, when the electric current is passed through the track;

wherein a data bit is selectively writable into the data regions of the magnetic film, using a fringing field from the magnetic domain wall in the track to selectively change a direction of a magnetic moment in a storage region within the track.

67. The method of claim 66, wherein forming the at least one writing element comprises:

forming an upper track above the magnetic film; and forming a lower track below the magnetic film.

68. The method of claim 67, wherein a data bit is selectively writable into a data region of the magnetic film where the upper track and the lower track cross, using fringing fields from magnetic domain walls in the upper track and the lower track.

69. The method of claim 68, wherein forming the upper track comprises pinning the magnetic domain walls in the upper track.

70. The method of claim 68, wherein forming the lower track comprises pinning the magnetic domain walls in the lower track.

71. The method of claim 67, wherein the at least one writing element comprises a plurality of upper tracks and a plurality of lower tracks.

72. The method of claim 71, wherein each of the plurality of upper tracks and the plurality of lower tracks comprises an individual magnetic wire.

73. The method of claim 67, wherein forming the upper track comprises forming a bend;

wherein forming the lower track comprises forming a bend; and wherein the data region corresponds to a region of the magnetic film where the bend of the upper track and the bend of the lower track cross.

74. The method of claim 67, wherein forming the upper track comprises forming a block of magnetic material selected from the group consisting of ferromagnetic material and ferrimagnetic material;

wherein forming the lower track comprises forming a block of magnetic material selected from the group consisting of ferromagnetic material and ferrimagnetic material; and wherein the data region corresponds to a region of the magnetic film where the block of the upper track and the block of the lower track cross.

75. The method of claim 67, wherein forming the upper track and the lower track comprises forming at least one of the upper track or the lower track of alternating types of magnetic materials selected from the group consisting of ferromagnetic material and ferrimagnetic material.

76. The method of claim 67, wherein the magnetic film comprises an upper surface and a lower surface; and further comprising forming an insulating tunnel barrier layer that coats both the upper and lower surfaces of the magnetic film.

77. The method of claim 66, wherein forming the magnetic film comprises forming an unstructured magnetic film so as to render the location of the data bit non-localized.

78. The method of claim 66, wherein forming the magnetic film comprises forming a single magnetic layer.

79. The method of claim 66, wherein forming the magnetic film comprises forming a plurality of superimposed magnetic layers; and
wherein at least some of the superimposed magnetic layers are separated by at least one insulating layer.

80. The method of claim 66, wherein forming the at least one writing element comprises using homogeneous magnetic material selected from the group consisting of ferromagnetic material and ferrimagnetic material.

81. The method of claim 66, wherein forming the at least one writing element comprises using inhomogeneous magnetic material selected from the group consisting of ferromagnetic material and ferrimagnetic material.

82. The method of claim 66, wherein forming the magnetic film comprises patterning the magnetic film.

83. The method of claim 82, wherein the patterned magnetic film comprises a plurality of patterned magnetic sections.

84. The method of claim 83, wherein each of the plurality of patterned magnetic sections stores at least one data bit.

85. The method of claim 83, wherein the plurality of patterned magnetic sections are similarly shaped.

86. The method of claim 83, wherein patterning the plurality of patterned magnetic sections comprises patterning at least some of the plurality of patterned magnetic sections into non-similarly shaped magnetic sections.

87. The method of claim 83, wherein patterning the plurality of patterned magnetic sections comprises patterning at least some of the plurality of patterned magnetic sections into circularly shaped magnetic sections.

88. The method of claim 83, wherein patterning the plurality of patterned magnetic sections comprises patterning at least some of the plurality of patterned magnetic sections into rectangularly shaped magnetic sections.

89. The method of claim 83, wherein patterning the plurality of patterned magnetic sections comprises patterning at least some of the plurality of patterned magnetic sections into a plurality of rows.

90. The method of claim 83, wherein patterning the plurality of patterned magnetic sections comprises patterning at least some of the plurality of patterned magnetic sections into a plurality of columns.

91. The method of claim 83, wherein patterning the plurality of patterned magnetic sections comprises patterning at least some of the plurality of patterned magnetic sections into a plurality of rows and a plurality of columns.

92. The data storage device of claim 66, further comprising overlying an insulating layer on one side of the track.

93. The method of claim 92, wherein overlying the insulating layer comprises patterning the insulating layer into a plurality of patterned insulation sections.

94. The method of claim 93, wherein the plurality of patterned magnetic sections cross with the plurality of patterned insulation sections.

95. The method of claim 66, further comprising connecting a switch to the track, to pass current through the track for the purpose of writing the data bit.

96. The method of claim 95, wherein the switch comprises a transistor.

97. The method of claim 66, further comprising forming an insulating tunnel barrier layer in proximity to the magnetic film.

98. The method of claim 88, wherein the insulating tunnel barrier layer and the magnetic film form a tunnel junction.

99. A method of writing a data bit on a data storage device that comprises a continuous, unpatterned magnetic film that defines a plurality of data regions for storing data; and at least one writing element for disposal as a track in proximity to the magnetic film, wherein the track defines a magnetic domain wall that is caused to shift along the track in a direction of an electric current, when the electric current is passed through the track, the method comprising:
selectively writing the data bit into the data regions of the magnetic film using a fringing field from the magnetic domain wall in the track to selectively change a direction of a magnetic moment in a storage region within the track.

100. The method of claim 99, further comprising connecting a switch to the track, to pass current through the track for the purpose of writing the data bit.

101. The method of claim 99, wherein the track comprises an individual magnetic wire.

102. The method of claim 101, wherein the track defines a plurality of selectable data regions on the magnetic film.

103. The method of claim 99, wherein the magnetic film is unstructured so as to render the location of the data bit non-localized.

104. The method of claim 99, wherein selectively writing the data bit comprises coincidentally moving the fringing field from the magnetic domain wall in the track toward the magnetic film to change a direction of a magnetic moment in the data region.

105. The method of claim 104, wherein coincidentally moving the fringing field from the magnetic domain wall in the track comprising passing a writing current in the track.

106. The method of claim 105, wherein passing the current in a first direction causes the data bit to assume a first binary state; and
wherein passing the current in a second direction causes the data bit to assume a second binary state.

107. The method of claim 99, further comprising pinning the magnetic domain wall in the track.

108. The method of claim 99, further comprising selectively reading the data bit in the data region by passing a reading current in the track that crosses with the data region.

109. The method of claim 108, wherein selectively reading the data comprises measuring a change in resistance of the insulating tunnel barrier layer.

110. A method of reading a data bit on a data storage device, comprising:
the data storage device being formed by disposing a tunnel junction that is comprised of an insulating tunnel barrier layer, in proximity to a continuous, unpatterned magnetic film that defines a plurality of data regions for storing data; and
selectively reading the data bit stored in the data regions of the magnetic film by passing a reading current in the track that crosses with the data regions.

111. The method of claim 110, wherein selectively reading the data bit comprises measuring a change in resistance of the insulating tunnel barrier layer.

112. The method of claim 110, wherein the track comprises an individual magnetic wire.

113. The method of claim 112, wherein the track defines a plurality of selectable data regions on the magnetic film.

114. The method of claim 110, wherein the magnetic film is unstructured so as to render the location of the data bit non-localized.

115. An apparatus for reading a data bit on a data storage device, comprising:
a tunnel junction formed by disposing an insulating tunnel barrier layer in proximity to a continuous, unpatterned magnetic film that defines a plurality of data regions for storing data;

a reading element that selectively reads the data bit stored in the data regions of the magnetic film, by passing a reading current in the tunnel junction through the data regions.

116. The apparatus of claim 115, wherein the reading element selectively reads the data by measuring a change in resistance of the insulating tunnel barrier layer.

117. The apparatus of claim 115, wherein the magnetic film comprises an individual magnetic wire.

118. The apparatus of claim 117, wherein the individual magnetic wire defines a plurality of selectable data regions.

119. The apparatus of claim 115, wherein the magnetic film is unstructured so as to render the location of the data bit non-localized.

* * * * *